(12) United States Patent
Lee et al.

(10) Patent No.: US 12,165,905 B2
(45) Date of Patent: Dec. 10, 2024

(54) PROCESS KIT ENCLOSURE SYSTEM

(71) Applicant: Applied Materials, Inc., Santa Clara, CA (US)

(72) Inventors: Helder Lee, San Jose, CA (US); Nicholas Michael Kopec, Santa Clara, CA (US); Leon Volfovski, Mountain View, CA (US); Douglas R. McAllister, San Ramon, CA (US); Andreas Schmid, Meyriez (CH); Jeffrey Hudgens, San Francisco, CA (US); Yogananda Sarode Vishwanath, Bangalore (IN); Steven Babayan, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 765 days.

(21) Appl. No.: 16/417,348

(22) Filed: May 20, 2019

(65) Prior Publication Data
US 2020/0373190 A1 Nov. 26, 2020

(51) Int. Cl.
*H01L 21/687* (2006.01)
*H01L 21/673* (2006.01)
(Continued)

(52) U.S. Cl.
CPC .. *H01L 21/68707* (2013.01); *H01L 21/67383* (2013.01); *H01L 21/67386* (2013.01);
(Continued)

(58) Field of Classification Search
CPC ........... H01L 21/6735; H01L 21/67386; H01L 21/67363; H01L 21/6773; H01L 21/67763;
(Continued)

(56) References Cited

U.S. PATENT DOCUMENTS 6,199,291 B1 3/2001 Ozee
7,792,350 B2 9/2010 Kiley et al.
(Continued)

FOREIGN PATENT DOCUMENTS

JP H0353487 A 3/1991
JP 2009095783 A 4/1997
(Continued)

OTHER PUBLICATIONS

Entegris F300 AUTOPOD, Wafer Carrier Clean, secure wafer transport and optimum automation integration, https://www.entegris.com/content/dam/shared-product-assets/wafer-processing/datasheet-f300-foup-6073.pdf Retrieved May 20, 2019.
(Continued)

*Primary Examiner* — Karla A Moore
*Assistant Examiner* — Nathan K Ford
(74) *Attorney, Agent, or Firm* — Lowenstein Sandler LLP

(57) ABSTRACT

A process kit enclosure system includes surfaces to enclose an interior volume, a first support structure including first fins, a second support structure including second fins, and a front interface to interface the process kit enclosure system with a load port of a wafer processing system. The first and second fins are sized and spaced to hold process kit ring carriers and process kit rings in the interior volume. Each of the process kit rings is secured to one of the process kit ring carriers. The process kit enclosure system enables first automated transfer of a first process kit ring carrier securing a first process kit ring from the process kit enclosure system into the wafer processing system and second automated transfer of a second process kit ring carrier securing a second process kit ring from the wafer processing system into the process kit enclosure system.

20 Claims, 8 Drawing Sheets

(51) Int. Cl.
*H01L 21/677* (2006.01)
*H01L 21/68* (2006.01)

(52) U.S. Cl.
CPC .... *H01L 21/6773* (2013.01); *H01L 21/67766* (2013.01); *H01L 21/67772* (2013.01); *H01L 21/67781* (2013.01); *H01L 21/68* (2013.01)

(58) Field of Classification Search
CPC ........... H01L 21/6732; H01L 21/67769; H01L 21/67778
See application file for complete search history.

(56) References Cited

U.S. PATENT DOCUMENTS

| | | | |
|---|---|---|---|
| 8,397,739 | B2 | 3/2013 | Gregor et al. |
| 8,784,033 | B2 | 7/2014 | Kremerman et al. |
| 9,457,464 | B2 | 10/2016 | Kremerman et al. |
| 9,579,788 | B2 | 2/2017 | Rosenberg et al. |
| 9,881,820 | B2 | 1/2018 | Wong et al. |
| 9,947,517 | B1 | 4/2018 | Luere et al. |
| 10,014,198 | B2 | 7/2018 | Richardson |
| 10,041,868 | B2 | 8/2018 | Gottscho |
| 10,062,589 | B2 | 8/2018 | Wong et al. |
| 10,062,590 | B2 | 8/2018 | Wong et al. |
| 10,062,599 | B2 | 8/2018 | Genetti et al. |
| 10,103,010 | B2 | 10/2018 | Luere et al. |
| 10,124,492 | B2 | 11/2018 | Genetti et al. |
| 2005/0205209 | A1 | 9/2005 | Mosden |
| 2013/0341239 | A1* | 12/2013 | Inoue ................. H01L 21/6732 206/711 |
| 2016/0211165 | A1 | 7/2016 | McChesney et al. |
| 2016/0211166 | A1 | 7/2016 | Yan et al. |
| 2016/0216185 | A1 | 7/2016 | Gottscho |
| 2017/0053819 | A1 | 2/2017 | Richardson |
| 2017/0113355 | A1* | 4/2017 | Genetti ............. H01L 21/67742 |
| 2017/0115657 | A1 | 4/2017 | Trussell et al. |
| 2017/0117170 | A1 | 4/2017 | Wong et al. |
| 2017/0117172 | A1 | 4/2017 | Genetti et al. |
| 2017/0119339 | A1 | 5/2017 | Johnson et al. |
| 2017/0133283 | A1 | 5/2017 | Kenworthy |
| 2017/0213758 | A1 | 7/2017 | Rice et al. |
| 2017/0236688 | A1 | 8/2017 | Caron et al. |
| 2017/0236741 | A1 | 8/2017 | Angelov et al. |
| 2017/0236743 | A1 | 8/2017 | Severson et al. |
| 2017/0263478 | A1 | 9/2017 | McChesney et al. |
| 2017/0287682 | A1 | 10/2017 | Musselman et al. |
| 2017/0287753 | A1 | 10/2017 | Musselman et al. |
| 2017/0330786 | A1 | 11/2017 | Genetti et al. |
| 2017/0334074 | A1 | 11/2017 | Genetti et al. |
| 2018/0019107 | A1 | 1/2018 | Ishizawa |
| 2018/0019142 | A1* | 1/2018 | Wong ................ H01L 21/67201 |
| 2018/0032062 | A1 | 2/2018 | Trussell et al. |
| 2018/0040492 | A1 | 2/2018 | Wong et al. |
| 2018/0068879 | A1 | 3/2018 | Wong et al. |
| 2018/0090354 | A1 | 3/2018 | Sugita et al. |
| 2018/0119142 | A1 | 5/2018 | Rigo |
| 2018/0166259 | A1 | 6/2018 | Ueda |
| 2018/0218933 | A1 | 8/2018 | Luere et al. |
| 2018/0233328 | A1 | 8/2018 | Ueda et al. |
| 2018/0277416 | A1 | 9/2018 | Takahashi et al. |
| 2018/0301322 | A1 | 10/2018 | Sugita et al. |
| 2018/0315583 | A1 | 11/2018 | Luere et al. |
| 2018/0315640 | A1 | 11/2018 | Ueda et al. |
| 2019/0088531 | A1* | 3/2019 | Sarode Vishwanath ..................... H01L 21/6831 |

FOREIGN PATENT DOCUMENTS

| | | |
|---|---|---|
| JP | 10165884 A | 6/1998 |
| JP | 200471617 A | 3/2004 |
| JP | 4559317 B2 | 10/2010 |
| JP | 2012216614 A | 11/2012 |
| JP | 201957709 A | 4/2019 |
| KR | 10-2014-0058270 A | 5/2014 |
| KR | 1020160016409 A | 2/2016 |
| WO | 2015130690 A1 | 9/2015 |
| WO | 2020236906 A1 | 11/2020 |

OTHER PUBLICATIONS

Entegreis Spectra Foup, Front opening unified pod platform with superior microenvironment control, https://www.entegris.com/content/dam/shared-product-assets/wafer-processing/datasheet-spectra-foup-2413.pdf Retrieved May 20, 2019.
International Seach Report and Written Opinion dated Sep. 4, 2020, on application No. PCT/US2020/033755.
International Seach Report and Written Opinion dated Sep. 1, 2020, on application No. PCT/US2020/033774.
International Preliminary Report on Patentability for International Application No. PCT/US2020/033755, mailed Dec. 2, 2021, 10 Pages.

* cited by examiner

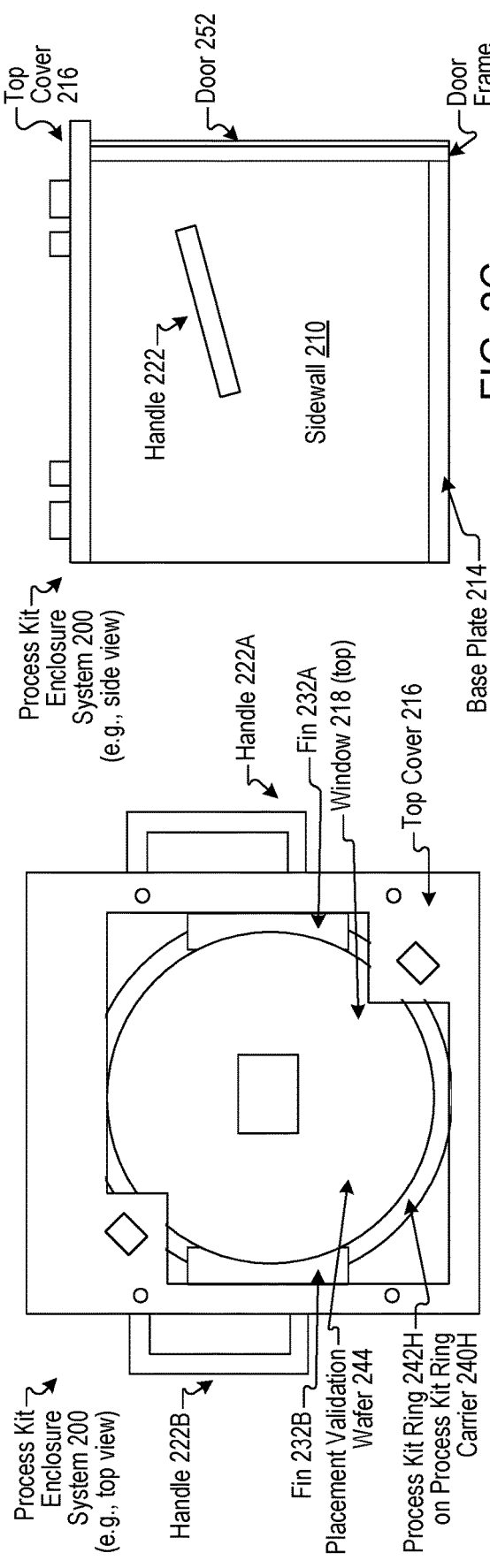
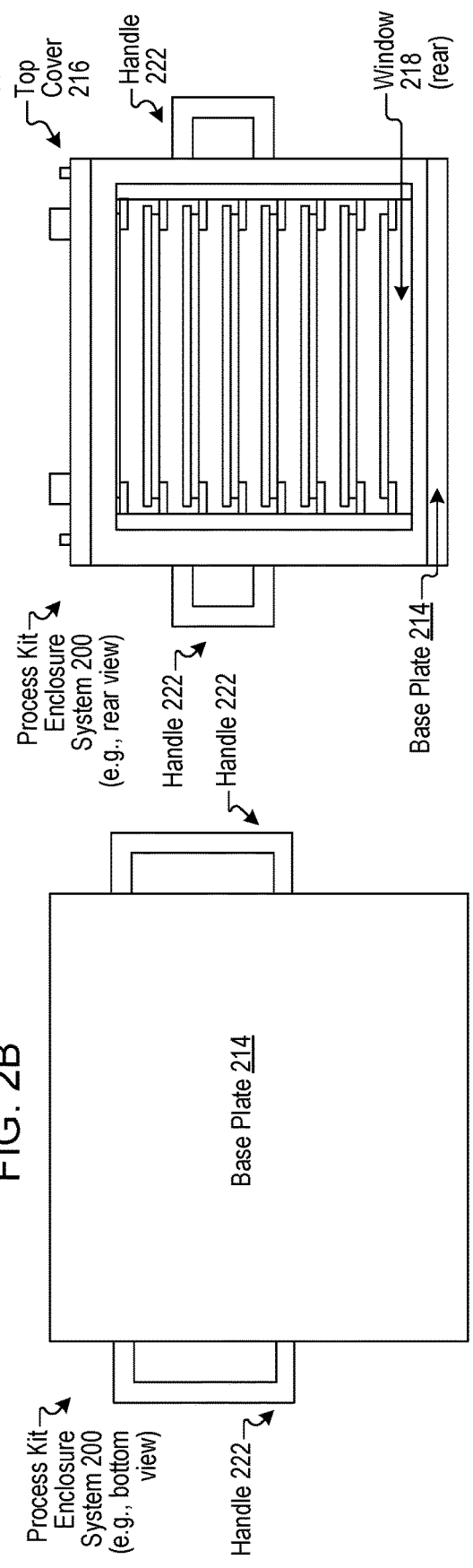
FIG. 2B
FIG. 2C
FIG. 2D
FIG. 2E

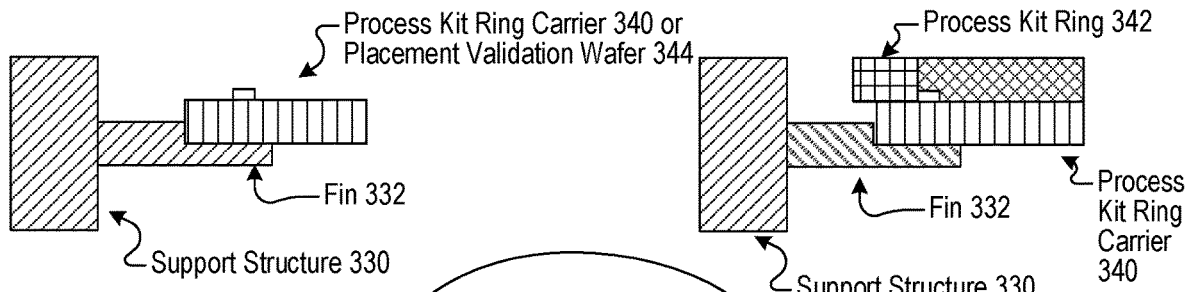
FIG. 3A
FIG. 3B
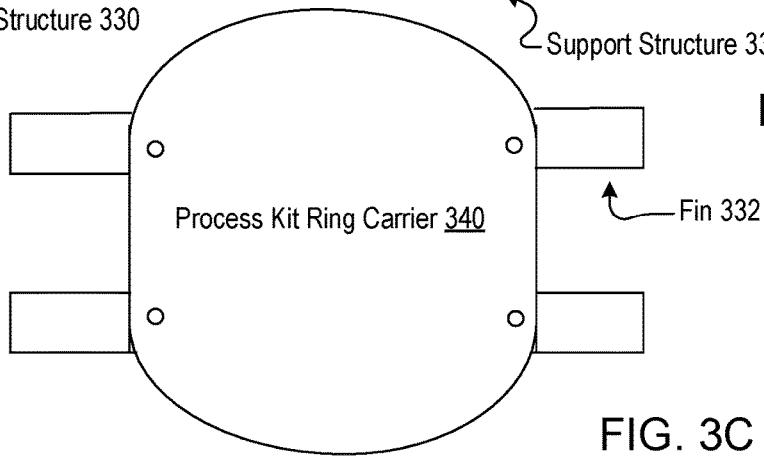
FIG. 3C
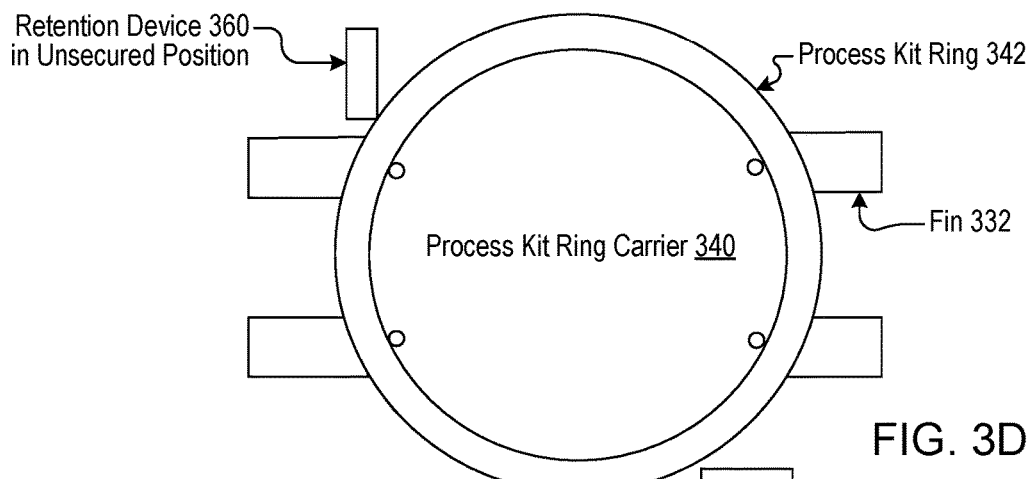
FIG. 3D
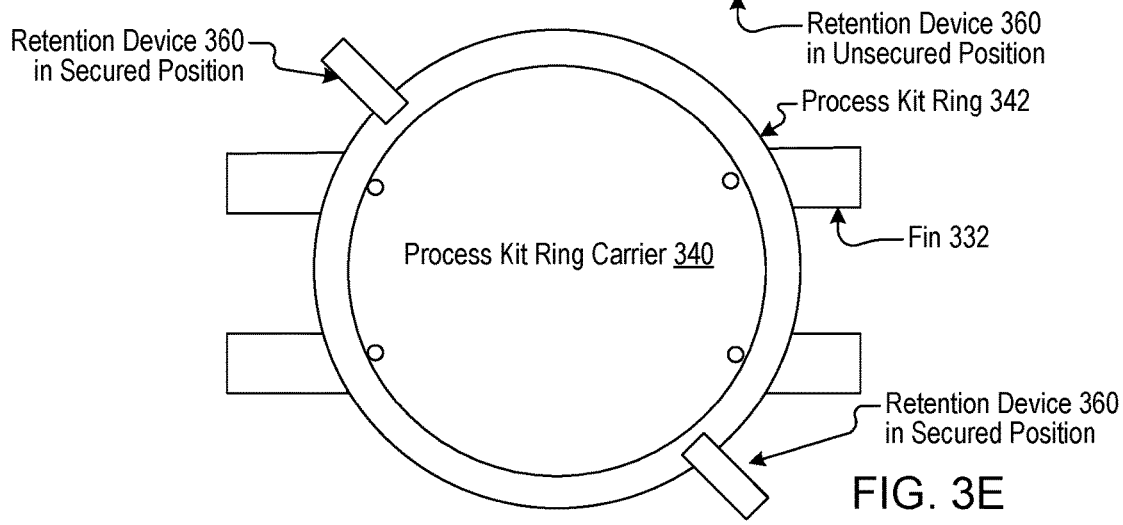
FIG. 3E

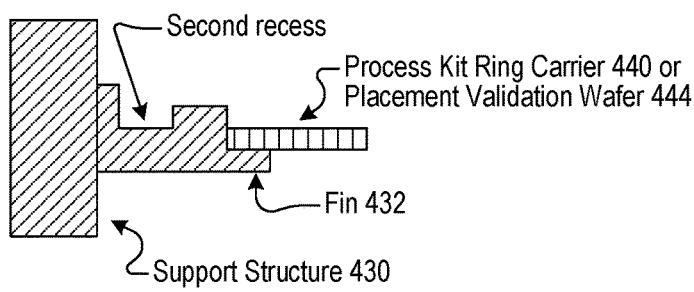
FIG. 4A
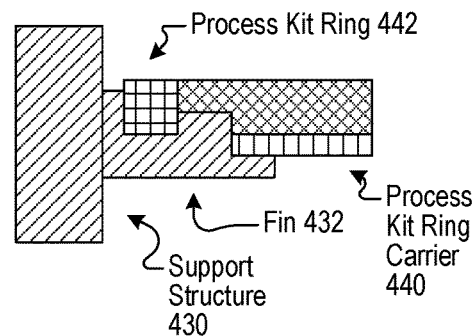
FIG. 4B
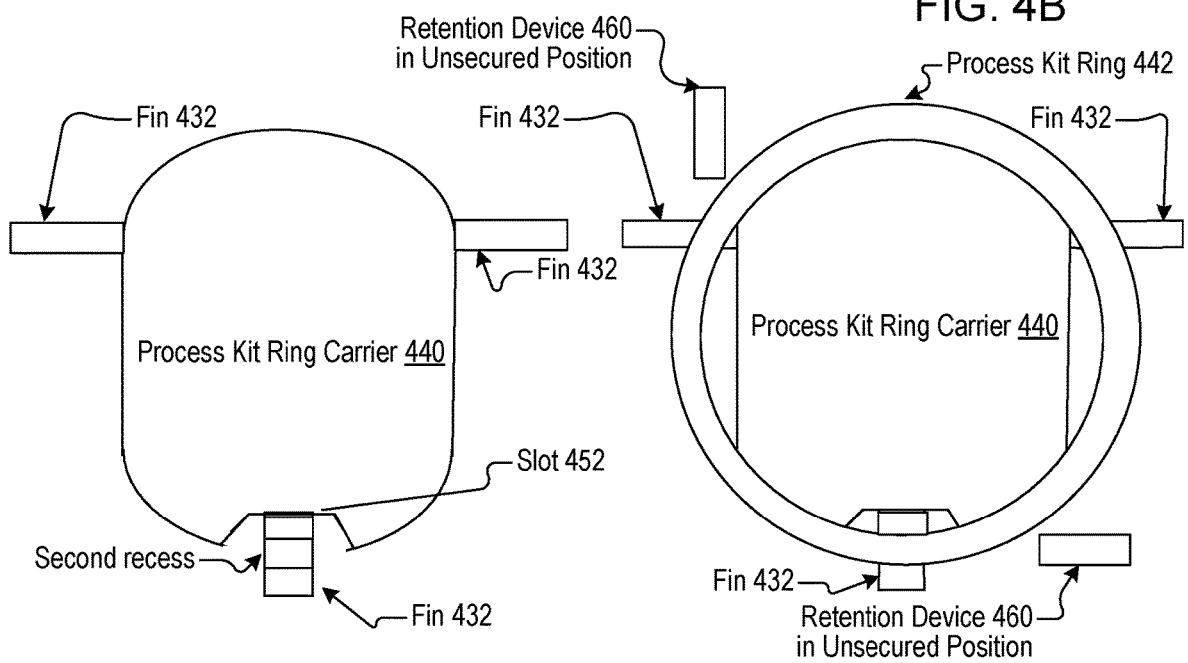
FIG. 4C
FIG. 4D
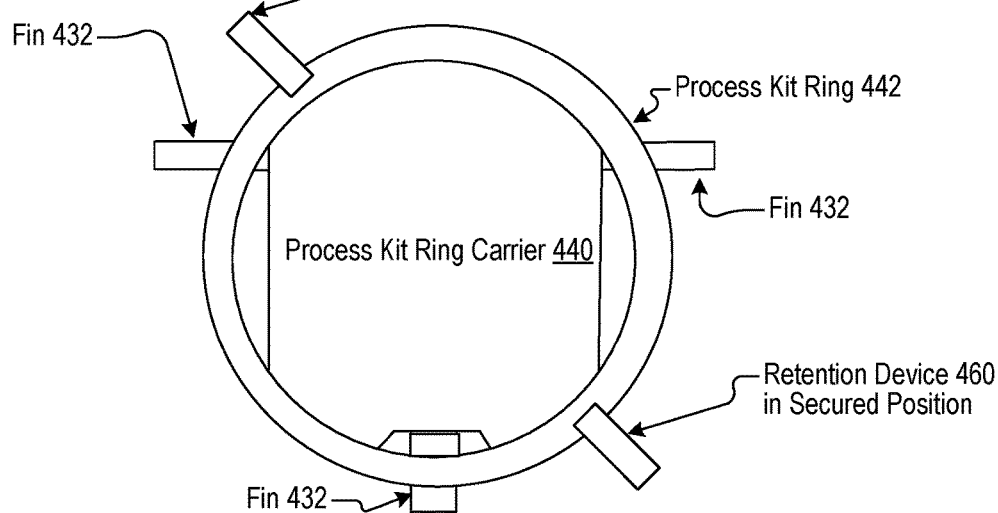
FIG. 4E

PROCESS KIT ENCLOSURE SYSTEM

TECHNICAL FIELD

Embodiments of the present disclosure relate to apparatuses and methods for process kit ring replacement in processing chambers, such as those used in wafer processing systems, and in particular to an enclosure for holding process kit rings.

BACKGROUND

In semiconductor processing and other electronics processing, platforms are often used that use robotic arms to transport objects such as wafers between processing chambers, from storage areas (e.g., front opening unified pods (FOUPs)) to processing chambers, from processing chambers to storage areas, and so on. A processing system, such as a wafer processing system, has one or more processing chambers for processing of substrates. A gas may be used to etch a substrate in a processing chamber (e.g., a substrate may be etched while electrostatically clamped in position in an etch chamber). One or more process kit rings may surround a substrate (e.g., to protect one or more portions of the processing chamber, the substrate, etc.). For example, a circular part, referred to as an edge ring or process kit ring, is positioned immediately outside of the outer diameter of the substrate to protect the upper surface of a chuck (e.g., an electrostatic chuck) supporting the substrate from being etched by etchant chemistry. Process kit rings are made from several different materials and can have different shapes, both which affect process uniformity near the process kit ring. During processing, process kit rings are etched over time and result in shape changes as well as changes in processing uniformity.

To address the changes in processing uniformity due to process kit ring deterioration, process kit rings are replaced according to a schedule. Conventionally, to replace a process kit ring, an operator opens a processing chamber to have access to the process kit ring inside, manually removes and replaces the process kit ring, and closes the processing chamber. While the processing chamber is open, the processing chamber and the processing system may become contaminated with cells, hair, dust, etc. The processing chamber and/or processing system then goes through a requalification process that may remove the processing chamber and/or processing system from operation for days to weeks. This impacts line yield, scheduling, quality (e.g., responsive to adding variables to the system), and so forth.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a process kit enclosure system includes a plurality of surfaces to at least partially enclose an interior volume of the process kit enclosure system. The process kit enclosure system further includes a first support structure comprising a first plurality of approximately horizontal fins. The process kit enclosure system further includes a second support structure comprising a second plurality of approximately horizontal fins. The first plurality of approximately horizontal fins and the second plurality of approximately horizontal fins are sized and spaced to hold a plurality of process kit ring carriers and a plurality of process kit rings in the interior volume of the process kit enclosure system. Each of the plurality of process kit rings may be secured to one of the plurality of process kit ring carriers. The process kit enclosure system further includes a front interface coupled to one or more of the plurality of surfaces to interface the process kit enclosure system with a load port of a wafer processing system. The process kit enclosure system enables first automated transfer of a first process kit ring carrier securing a first process kit ring from the process kit enclosure system into the wafer processing system and second automated transfer of a second process kit ring carrier securing a second process kit ring from the wafer processing system into the process kit enclosure system.

In another aspect of the disclosure, a method includes interfacing a front interface of a process kit enclosure system with a load port of a wafer processing system. The process kit enclosure system includes a plurality of process kit ring carriers and a plurality of process kit rings in an interior volume of the process kit enclosure system. The interior volume is enclosed by a plurality of surfaces of the process kit enclosure system to which the front interface is coupled. Each of the plurality of process kit rings is secured to one of the plurality of process kit ring carriers. Each of the plurality of process kit ring carriers are placed on a corresponding first approximately horizontal fin of a first plurality of approximately horizontal fins of a first support structure and on a corresponding second approximately horizontal fin of a second plurality of approximately horizontal fins of a second support structure. The method further includes using a robot arm to perform automated transfer of first process kit ring carrier securing a first process kit ring from the process kit enclosure system from the process kit enclosure system into the wafer processing system. The method further includes using the robot arm or an additional robot arm to perform second automated transfer of a second process kit ring carrier securing a used second process kit ring from the wafer processing system into the process kit enclosure system.

In another aspect of the disclosure, a process kit enclosure system includes a plurality of surfaces to at least partially enclose an interior volume of the process kit enclosure system. The process kit enclosure system further includes a first support structure disposed within the interior volume. The process kit enclosure system further includes a second support structure disposed within the interior volume. The process kit enclosure system further includes an empty process kit ring carrier disposed on a first approximately horizontal fin of the first support structure and on a second approximately horizontal fin of the second support structure. The process kit enclosure system further includes a plurality of process kit ring carriers disposed on corresponding approximately horizontal fins of the first support structure and the second support structure. The plurality of process kit ring carriers may be are positioned above the empty process kit ring carrier in the process kit enclosure system. A corresponding process kit ring may be secured to each of the plurality of process kit ring carriers. The process kit enclosure system further includes placement validation wafer disposed on a third approximately horizontal fin of the first support structure and on a fourth approximately horizontal fin of the second support structure. The placement validation wafer is positioned above the plurality of process kit ring carriers in the process kit enclosure system.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2B illustrates a top view of a process kit enclosure system, according to certain embodiments.

FIG. 2C illustrates a side view of a process kit enclosure system, according to certain embodiments.

FIG. 2D illustrates a bottom view of a process kit enclosure system, according to certain embodiments.

FIG. 2E illustrates a rear view of a process kit enclosure system, according to certain embodiments.

FIG. 3A illustrates a cross sectional view of content on a fin of a support structure of a process kit enclosure system, according to certain embodiments.

FIG. 3B illustrates a cross sectional view of a process kit ring disposed on a process kit ring carrier on a fin of a support structure of a process kit enclosure system, according to certain embodiments.

FIG. 3C illustrates a top view of a process kit ring carrier on fins of support structures of a process kit enclosure system, according to certain embodiments.

FIG. 3D illustrates a top view of retention devices and a process kit ring disposed on a process kit ring carrier on fin of support structures of a process kit enclosure system, according to certain embodiments.

FIG. 3E illustrates a top view of retention devices securing a process kit ring disposed on a process kit ring carrier on a fin of a support structure of a process kit enclosure system, according to certain embodiments.

FIG. 4A illustrates a cross sectional view of content on a fin of a support structure of a process kit enclosure system, according to certain embodiments.

FIG. 4B illustrates a cross sectional view of a process kit ring disposed on a process kit ring carrier on a fin of a support structure of a process kit enclosure system, according to certain embodiments.

FIG. 4C illustrates a top view of a process kit ring carrier on fins of support structures of a process kit enclosure system, according to certain embodiments.

FIG. 4D illustrates a top view of retention devices and a process kit ring disposed on a process kit ring carrier on fins of support structures of a process kit enclosure system, according to certain embodiments.

FIG. 4E illustrates a top view of retention devices securing a process kit ring disposed on a process kit ring carrier on fins of support structures of a process kit enclosure system, according to certain embodiments.

DETAILED DESCRIPTION OF EMBODIMENTS

Figure 1:
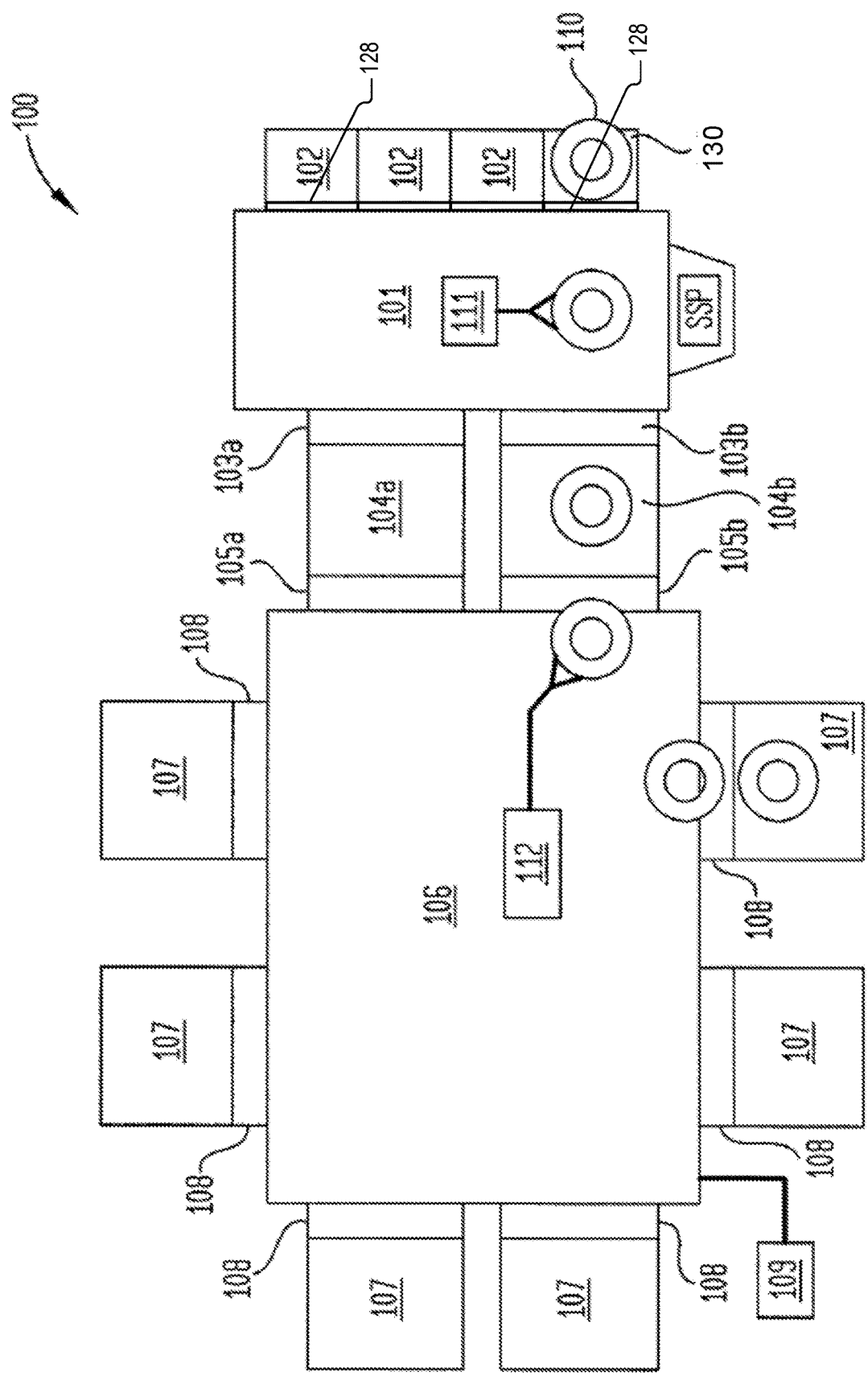
FIG. 1 illustrates a processing system, according to one aspect of the disclosure.

Embodiments described herein are related to a process kit enclosure system. Process kit rings may surround substrates and/or portions of substrate support assemblies in a processing chamber to protect components (e.g., to protect the substrate support assembly) of the processing chamber. As the substrates are etched by etchant chemistry, the process kit rings may deteriorate over time. Deteriorated processing kit rings lead to processing non-uniformity (e.g., non-uniformity in processed substrates, non-uniformity in processes, etc.). To avoid non-uniformity, process kit rings are to be periodically replaced. Conventionally, to replace a process kit ring, the processing chamber is opened. After being opened, the processing chamber goes through a long requalification process. The requalification process impacts line yield, scheduling, quality, user time, energy used, and so forth.

The devices, systems, and methods disclosed herein use a process kit enclosure system (e.g., a front opening unified pod (FOUP) configured to contain one or more process kit rings) to enable automated replacement of process kit rings (e.g., without opening a process chamber). A process kit enclosure system may include surfaces to at least partially enclose an interior volume of the process kit enclosure system. For example, the process kit enclosure system may include sidewalls, a top cover, a bottom surface, and a door. The process kit enclosure system may include a front interface (e.g., door frame, etc.) to interface with a load port of a wafer processing system (e.g., a port of a factory interface). A door may be attached to the front interface of the process kit enclosure system for transportation and the door may be removed to engage the front interface with the load port. The process kit enclosure system may include a first support structure that includes first approximately horizontal fins and a second support structure that includes second approximately horizontal fins. The first approximately horizontal fins and the second approximately horizontal fins may be sized and spaced to hold contents such as one or more of a process kit ring, an empty process kit ring carrier, a process kit ring disposed on a process kit ring carrier, a placement validation wafer, etc. The process kit enclosure system may enable automated transfer of content (e.g., a new process kit ring secured on a process kit ring carrier, etc.) into the wafer processing system and automated transfer of content (e.g., a used process kit ring secured on a process kit ring carrier, etc.) from the wafer processing system into the process kit enclosure system.

The devices, systems, and methods disclosed herein have advantages over conventional solutions. The process kit enclosure system may interface with a load port of the wafer processing system and enable replacement of process kit rings without opening of a process chamber and without a subsequent requalification process of the process chamber. The load port may be configured to accept different types of enclosure systems, such as a front opening unified pod (FOUP). The load port may seal to the front interface of the process kit enclosure system to prevent contamination into the wafer processing system (factory interface) and to prevent harmful gases from exiting the wafer processing system (factory interface). The process kit enclosure system may include empty process kit ring carriers that a robot arm of the wafer processing system may use to remove a used process kit ring from the wafer processing system to place in the process kit enclosure system. The process kit enclosure system may include process kit rings that a robot arm may use to replace used process kit rings in the wafer processing system. The process kit enclosure system may include a placement validation wafer that the robot arm may use to verify placement of the process kit rings. The process kit enclosure system may enable removal of process kit rings, replacement of process kit rings, and verification of placement of the process kit rings without opening of any of the process chambers attached to the processing system and without undergoing the conventional requalification process for any process chamber. Use of the process kit enclosure system to replace process kit rings has less impact on line yield, scheduling, quality, user time, energy used, and so forth than conventional solutions.

FIG. 1 illustrates a processing system 100 (e.g., a wafer processing system), according to one aspect of the disclosure. The processing system 100 includes a factory interface 101 that includes multiple load ports 128 to which cassettes 102 (e.g., FOUPs) may be coupled for transferring wafers and/or other substrates into and out of the processing system 100. The factory interface may also include a process kit enclosure system 130 (e.g., cassette, FOUP, etc.) coupled to a load port 128 for transferring content 110 such as process kit rings into and out of the processing system 100.

A load port 128 may include a front interface that forms a vertical opening. The load port 128 may also have a horizontal surface. A FOUP may have a front interface that forms a vertical opening. The front interface of the FOUP may be sized to interface with the front interface of the load port 128 (e.g., the vertical opening of the FOUP may be approximately the same size as the vertical opening of the load port 128). The FOUP may be placed on the horizontal surface of the load port 128 and the vertical opening of the FOUP may align with the vertical opening of the load port 128. The front interface of the FOUP may interconnect with (e.g., clamp to, be secured to, be sealed to) the front interface of the load port 128. A bottom plate (e.g., base plate) of the FOUP may have features (e.g., load features, such as recesses, that engage with load port kinematic pin features, a load port datum pin clearance, and/or a FOUP docking tray latch clamping feature) that engage with the horizontal surface of the load port 128. The process kit enclosure system 130 has a front interface that is also sized to interface with the front interface of the load port 128. The process kit enclosure system 130 may be placed on the horizontal surface of the load port 128 and the vertical opening of the process kit enclosure system 130 may align with the vertical opening of the load port 128. The front interface of the process kit enclosure system 130 may interconnect with the front interface of the load port 128. The process kit enclosure system 130 has a base plate that has features to engage with the horizontal surface of the load port 128. The process kit enclosure system 130 may interface with the same load ports 128 that are used for FOUPs and cassettes that contain wafers.

The process kit enclosure system 130 may include one or more items of content 110 (e.g., one or more of a process kit ring, an empty process kit ring carrier, a process kit ring disposed on a process kit ring carrier, a placement validation wafer, etc.). For example, the process kit enclosure system 130 may be coupled to the factory interface 101 (e.g., load port 128) to enable automated transfer of a process kit ring on a process kit ring carrier into the processing system 100 for replacement of a used process kit ring.

The processing system 100 may also include first vacuum ports 103a, 103b coupling the factory interface 101 to respective degassing chambers 104a, 104b. Second vacuum ports 105a, 105b may be coupled to respective degassing chambers 104a, 104b and disposed between the degassing chambers 104a, 104b and a transfer chamber 106 to facilitate transfer of wafers and content 110 (e.g., process kit rings) into the transfer chamber 106. In some embodiments, a processing system 100 includes and/or uses one or more degassing chambers 104 and a corresponding number of vacuum ports 103, 105 (e.g., a processing system 100 may include a single degassing chamber 104, a single first vacuum port 103, and a single second vacuum port 105). The transfer chamber 106 includes a plurality of processing chambers 107 (e.g., four processing chambers 107, six processing chambers, etc.) disposed therearound and coupled thereto. The processing chambers 107 are coupled to the transfer chamber 106 through respective ports 108, such as slit valves or the like. In some embodiments, the factory interface 101 is at a higher pressure (e.g., atmospheric pressure) and the transfer chamber 106 is at a lower pressure. Each degassing chamber 104 (e.g., load lock, pressure chamber) may have a first door (e.g., first vacuum port 103) to seal the degassing chamber 104 from the factory interface 101 and a second door (e.g., second vacuum port 105) to seal the degassing chamber 104 from the transfer chamber 106. Content may be transferred from the factory interface 101 into a degassing chamber 104 while the first door is open and the second door is closed, the first door may close, the pressure in the degassing chamber 104 may reduce to match the transfer chamber 106, the second door may open, and the content may be transferred out of the degassing chamber 104. A local center finding (LCF) device may be used to align the content in the transfer chamber 106 (e.g., before entering a processing chamber 107, after leaving the processing chamber 107).

The processing chambers 107 may include or more of etch chambers, deposition chambers (including atomic layer deposition, chemical vapor deposition, physical vapor deposition, or plasma enhanced versions thereof), anneal chambers, and the like. Some of the processing chambers 107, such as etch chambers, may include process kit rings (e.g., edge ring, processing ring, support ring, sliding ring, quartz ring, etc.) therein, which occasionally are to be replaced. While conventional systems are associated with disassembly of a processing chamber by an operator to replace a process kit ring, the processing system 100 is configured to facilitate replacement of process kit rings without disassembly of a processing chamber 107 by an operator.

Factory interface 101 includes a factory interface robot 111. Factory interface robot 111 may include a robot arm, and may be or include a selective compliance assembly robot arm (SCARA) robot, such as a 2 link SCARA robot, a 3 link SCARA robot, a 4 link SCARA robot, and so on. The factory interface robot 111 may include an end effector on an end of the robot arm. The end effector may be configured to pick up and handle specific objects, such as wafers. Alternatively, the end effector may be configured to handle objects such as process kit rings (edge rings). The factory interface robot 111 may be configured to transfer objects between cassettes 102 (e.g., FOUPs) and degassing chambers 104a, 104b.

Transfer chamber 106 includes a transfer chamber robot 112. Transfer chamber robot 112 may include a robot arm with an end effector at an end of the robot arm. The end effector may be configured to handle particular objects, such as wafers. The transfer chamber robot 112 may be a SCARA robot, but may have fewer links and/or fewer degrees of freedom than the factory interface robot 111 in some embodiments.

A controller 109 controls various aspects of the processing system 100. The controller 109 may be and/or include a computing device such as a personal computer, a server computer, a programmable logic controller (PLC), a microcontroller, and so on. The controller 109 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 109 may include a data storage device (e.g., one or more disk drives and/or solid state drives), a main memory, a static memory, a network interface, and/or other components. The controller 109 may execute instructions to perform any one or more of the methods or processes described herein. The instructions may be stored on a computer readable storage medium, which may include the main memory, static memory, secondary storage and/or processing device (during execution of the instructions). The controller 109 may receive signals from and send controls to factory interface robot 111 and wafer transfer chamber robot 112 in embodiments.

FIG. 1 schematically illustrates transfer of content 110 (e.g., a process kit ring coupled to a process kit ring carrier) into a processing chamber 107. According to one aspect of the disclosure, content 110 is removed from a process kit enclosure system 130 via factory interface robot 111 located in the factory interface 101. The factory interface robot 111 transfers the content 110 through one of the first vacuum ports 103a, 103b and into a respective degassing chamber 104a, 104b. A transfer chamber robot 112 located in the transfer chamber 106 removes the content 110 from one of the degassing chambers 104a, 104b through a second vacuum port 105a or 105b. The transfer chamber robot 112 moves the content 110 into the transfer chamber 106, where the content 110 may be transferred to a processing chamber 107 though a respective port 108. While not shown for clarity in FIG. 1, transfer of the content 110 may include transfer of a process kit ring disposed on a process kit ring carrier, transfer of an empty process kit ring carrier, transfer of a placement validation wafer, etc.

FIG. 1 illustrates one example of transfer of content 110, however, other examples are also contemplated. For example, it is contemplated that the process kit enclosure system 130 may be coupled to the transfer chamber 106 (e.g., via a load port in the transfer chamber 106). From the transfer chamber 106, the content 110 may be loaded into a processing chamber 107 by the transfer chamber robot 112. Additionally, content 110 may be loaded in a substrate support pedestal (SSP). An additional SSP may be positioned in communication with the factory interface 101 opposite the illustrated SSP. It is contemplated that a processed content 110 (e.g., a used process kit ring) may be removed from the processing system 100 in reverse of any manner described herein. When utilizing multiple process kit enclosure systems 130 or a combination of process kit enclosure system 130 and SSP, it is contemplated that one SSP or process kit enclosure system 130 may be used for unprocessed content 110 (e.g., new process kit rings), while another SSP or process kit enclosure system 130 may be used for receiving processed content 110 (e.g., used process kit rings).

In some embodiments, a process kit ring that is secured to an upper surface of a process kit ring carrier may be stored in the process kit enclosure system 130 and factory interface robot 111 may insert an end effector of the factory interface robot 111 into the process kit enclosure system 130 below the process kit ring carrier, lift the process kit ring carrier, and extract from the process kit enclosure system 130 to transport the process kit ring secured to the process kit ring carrier on the robot within the processing system 100. In some embodiments, a process kit ring is stored within the process kit enclosure system 130 (e.g., without being secured to a process kit ring carrier). Factory interface robot 111 may obtain an empty process kit ring carrier from within the processing system 100 or the process kit enclosure system 130 and may use the empty process kit ring carrier to remove the process kit ring from the process kit enclosure system 130 to transport the process kit ring secured to the process kit ring carrier within the processing system 100. In some embodiments, factory interface robot 111 may retrieve a process kit ring from a process kit enclosure system 130 and transport the process kit ring within the processing system 100 without use of a process kit ring carrier.

Figure 2A:
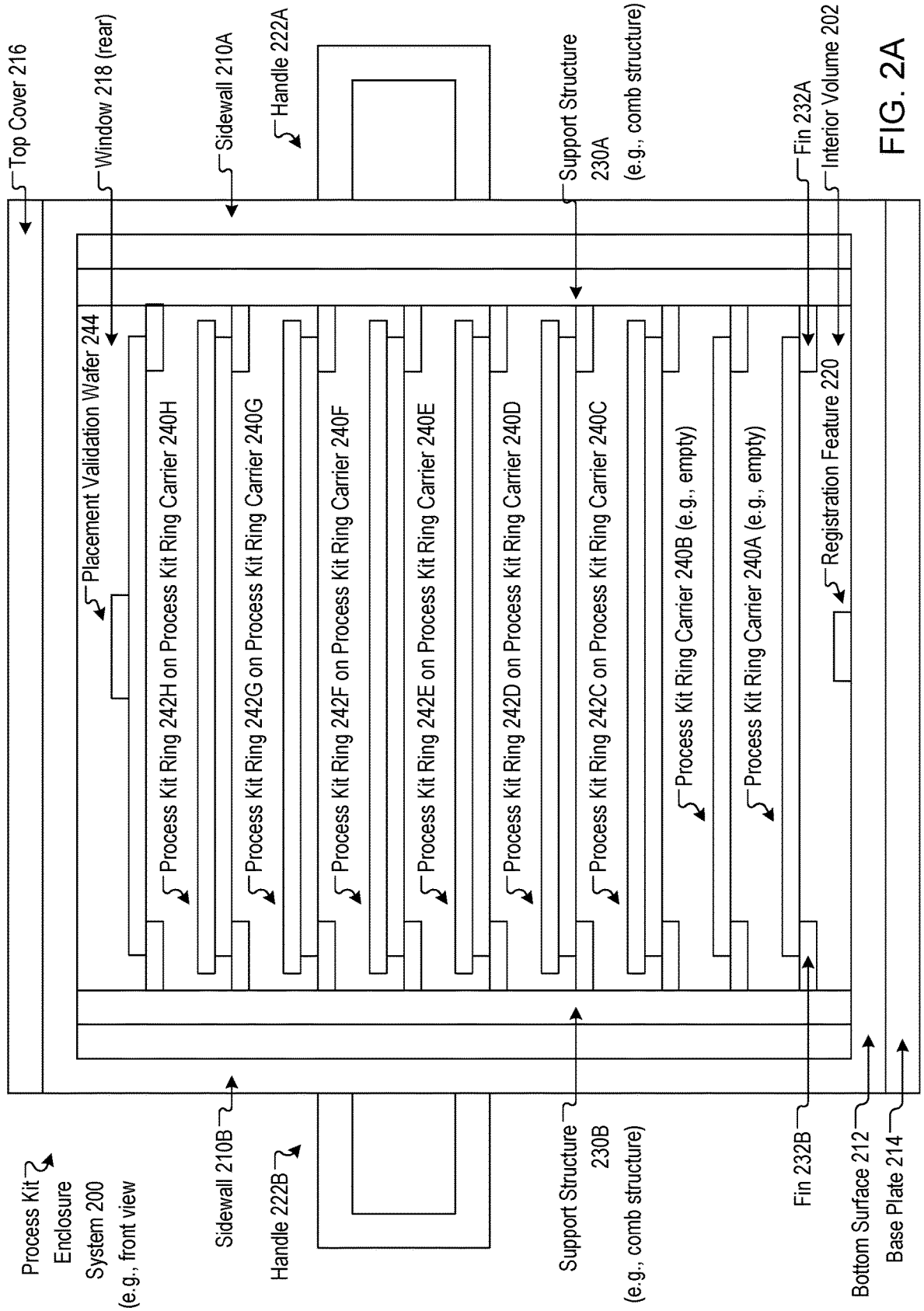
FIG. 2A illustrates a front view of a process kit enclosure system, according to certain embodiments.

FIG. 2A illustrates a front view of a process kit enclosure system 200, according to certain embodiments. The process kit enclosure system 200 may be used to securely hold process kit rings 242 and enable replacement of process kit rings 242 in a wafer processing system (e.g., processing system 100 of FIG. 1).

The process kit enclosure system 200 includes surfaces to at least partially enclose an interior volume 202 of the process kit enclosure system 200. The surfaces of the process kit enclosure system 200 that enclose the interior volume 202 may include one or more of sidewalls 210 (e.g., right sidewall 210A, left sidewall 210B, etc.), a bottom surface 212, a base plate 214, a top cover 216, a door frame 250 (see FIG. 2C), and a door 252 (see FIG. 2C). The door 252 of the process kit enclosure system 200 may be removable. For example, the door 252 may be attached to the process kit enclosure system 200 for transportation of the process kit enclosure system 200. The door 252 may be removed from the process kit enclosure system 200 to expose a front interface (e.g., door frame 250) of the process kit enclosure system 200 coupled to one or more of the surfaces of the process kit enclosure system 200 to interface the process kit enclosure system 200 with a load port of a wafer processing system (e.g., see processing system 100 of FIG. 1).

The process kit enclosure system 200 may meet one or more FOUP standards (e.g., size, weight, interface, handle clearance, etc.). For example, the process kit enclosure system 200 may interface with the same load port of a wafer processing system as a substrate FOUP. The process kit enclosure system 200 may have a weight of less than 35 pounds (lbs) for one-person lift. The process kit enclosure system 200 may meet one or more of the semiconductor equipment and materials international (SEMI) standards (e.g., use FOUP door per SEMI E15.1, docks on load ports per SEMI 47.1, sits on kinematic pins per SEMI E57, etc.).

One or more support structures 230 may be included in the interior volume 202 of the process kit enclosure system 200. In some embodiments, two support structures 230 are disposed in the interior volume 202 to support content (e.g., content 110 of FIG. 1). In some embodiments, three support structures 230 are disposed in the interior volume 202 to support content (e.g., content 110 of FIG. 1) (e.g., see FIGS. 4C-E). In some embodiments, four support structures 230 are disposed in the interior volume 202 to support content (e.g., content 110 of FIG. 1) (e.g., see FIGS. 3C-E). Other numbers of support structures may also be used.

In some embodiments, the support structures 230 are comb structures. The support structures 230 may be made of a plastic (e.g., polyethylene) and a strengthening material may be disposed within the support structures 230 (e.g., a carbon fiber fill, one or more vertical rods of strengthening material through the support structures, etc.). Each support structure 230 may include one or more fins 232 (e.g., approximately horizontal fins) to support content. Each item of content may be supported by two or more fins (e.g., fin 232A of support structure 230A and a fin 232B of support structure 230B) that are approximately horizontal and approximately parallel to each other. The support structures 230 may support content so that an end effector on a robot arm of the wafer processing system can be inserted below the content, lift the content, and retract the content from the process kit enclosure system 200.

The process kit enclosure system 200 may include two, three, or four support structures 230 in embodiments. Upper surfaces of the support structures 230 may be coupled to each other by a bridge bracket 234 (see FIG. 2F). Lower surfaces of the support structures 230 may be coupled to the base plate 214. Upper surfaces of the fins 232 may include a feature (e.g., indentation, recess) to interface with surfaces proximate the perimeter (e.g., sidewalls, lower surface) of the process kit ring carrier 240. For example, an upper surface of each fin 232 may have a recess and the process kit ring carrier 240 may be disposed in the recess. In some embodiments, the fins 232 support corners (e.g., where the perimeter transitions from curved to flat) of the process kit ring carrier 240.

The fins 232 of the support structures 230 may be sized and spaced to provide a clearance between the upper surface of the process kit ring 242 and the lower surface of the fin 232 that is directly above the process kit ring 242 that allows for fin 232 recess height, robot arm droop and tolerance, and fin-to-fin tolerance.

The interior volume 202 of the process kit enclosure system 200 may include at least one process kit ring 242 (e.g., supported by corresponding fins 232 of support structures 230) for automated transfer into the wafer processing system. A robot arm may remove the process kit ring 242 from the process kit enclosure system 200 for automated transfer to the process kit ring 242 to a process chamber of the wafer processing system. A robot arm may remove a used process kit ring from the process chamber for automated transfer into the process kit enclosure system 200.

A process kit ring 242 in the process kit enclosure system 200 may be secured to an upper surface of a process kit ring carrier 240. A robot arm may remove the process kit ring 242 from the process kit enclosure system 200 by inserting an end effector into the process kit enclosure system 200 below the process kit ring carrier 240, lifting the process kit ring carrier 240 and the process kit ring 242 (e.g., by at least a portion of an upper surface of the end effector contacting at least a portion of the lower surface of the process kit ring carrier 240), and extracting the process kit ring carrier 240 with the process kit ring 242 secured to the upper surface of the process kit ring carrier 240. The space between the fins 232 of support structure 230A and fins 232 of support structure 230 may allow the end effector to enter and lift content spanning from a fin 232 of support structure 230A to a fin 232 of support structure 230B without contacting the fins 232.

As described herein, a process kit ring 242 on a process kit ring carrier 240 may refer to one or more process kit rings disposed on the process kit ring carrier 240. For example, the process kit ring 242 may include two or more of an edge ring, processing ring, support ring, sliding ring, quartz ring, and/or the like that are disposed on the process kit ring carrier 240.

In some embodiments, a process kit ring 242 may be disposed directly on the fins 232 and the robot arm may obtain a process kit ring carrier 240 (e.g., from within the wafer processing system) to lift the process kit ring 242. In some embodiments, the robot arm may lift the process kit ring 242 without use of a process kit ring carrier 240. One or more process kit rings 242 may be disposed on each process kit ring carrier 240. For example, two or three process kit rings 242 may be nested within each other (e.g., a first process kit ring of a first diameter, a second process kit ring of a second diameter sized to fit within the first process kit ring, and a third process kit ring of a third diameter sized to fit within the second process kit ring) on the process kit ring carrier 240.

Each support structure 230 may include multiple fins 232 that are sized and spaced to hold content in the interior volume 202 of the process kit enclosure system 200. For example, one or more sets of substantially parallel fins 232 of support structures 230 may support an empty process kit ring carrier 240 (e.g., first set of substantially parallel fins 232 supports empty process kit ring carrier 240A, second set of substantially parallel fins 232 supports empty process kit ring carrier 240B). One or more sets of substantially parallel fins 232 of support structures 230 may support a process kit ring carrier 240 with a process kit ring 242 secured to the process kit ring carrier 240. In some embodiments, the support structures 230 support one, two, three, four, five, six, seven, eight, or some other number of process kit ring carriers 240 with a corresponding process kit ring 242 secured to the process kit ring carrier 240. In some embodiments, the fins 232 of support structures 230 support as many process kit ring carriers 240 with a corresponding process kit ring 242 secured to the process kit ring carrier 240 as there are processing chambers in the wafer processing system. For example, if the wafer processing system has six processing chambers, the process kit enclosure system 200 may include six process kit rings 242 (e.g., secured to a corresponding process kit ring carrier 240). If the wafer processing system has eight processing chambers, the process kit enclosure system 200 may include eight process kit rings 242 (e.g., secured to a corresponding process kit ring carrier 240).

A set of substantially parallel fins 232 of support structures 230 may support a placement validation wafer 244 (e.g., multi-function wafer). In some embodiments, the placement validation wafer 244 may be a similar size to wafers that are handled by the processing system. The placement validation wafer 244 may be located on a set of substantially parallel fins 232 to enable automated transfer of the placement validation wafer 244 into the wafer processing system to validate placement of process kit rings 242 in the wafer processing system. The fins used to support the placement validation wafer 244 may have a different spacing and/or size than the fins used to support the process kit rings and/or process kit ring carriers.

Each set of substantially parallel fins 232 may create a slot to support content. Each of one or more lower slots (e.g., the lowest slots) of the process kit enclosure system 200 may support an empty process kit ring carrier 240. An upper slot (e.g., the top slot) of the process kit enclosure system 200 may support the placement validation wafer 244. Each of one or more middle slots (e.g., above the empty process kit ring carriers 240, below the placement validation wafer 244) may support process kit ring carriers 240 that support a process kit ring 242. One or more sets of substantially parallel fins 232 (e.g., slots for a process kit ring 242 on a process kit ring carrier 240) may include a corresponding process kit ring orientation bracket. Each process kit ring orientation bracket may have one or more protrusions (e.g., pins) that engage with a flat portion of the interior surface of the process kit ring 242 to constrain movement (e.g., rotation, movement in x- and y-directions, etc.) of the process kit ring 242. The one or more protrusions of the process kit ring orientation bracket and one or more features (e.g., pin contacts, recesses, etc.) of the process kit ring carrier 240 may constrain movement of the process kit ring 242.

The robot arm may remove content (e.g., empty process kit ring carrier 240, process kit ring carrier 240 securing a process kit ring 242) from lower slots and place used content in the vacated lower slots to avoid contamination from used content (e.g., used process kit rings from the wafer processing system) falling on other content (e.g., new process kit rings 242, placement validation wafer 244). For example, one or more robot arms may remove an empty process kit ring carrier 240A from the first slot, retrieve a used process kit ring using the empty process kit ring carrier 240A, and replace the now full process kit ring carrier 240A and supported used process kit ring at the first slot. The robot arm(s) may then remove a new process kit ring 242C secured to a process kit ring carrier 240C from a third slot above the first and second slots, place the process kit ring 242C into a process chamber, and then replace the now empty process kit ring carrier 240C back in the third slot. This process may be repeated with the process kit ring carrier 240B and process kit ring 242D and process kit ring carrier 240D for a next process kit ring replacement, and so on.

An upper section of the process kit enclosure system 200 could include clean process kit rings 242 and a lower section could include dirty process kit rings 242 and empty process kit ring carriers 240. In some embodiments, the process kit enclosure system 200 includes one or more physical dividers. The upper section and the lower section may be separated by a physical divider to avoid contamination. In some embodiments, dirty process kit rings 242 may be inserted into the process kit enclosure system 200 below the clean process kit rings 242. In some embodiments, a first process kit enclosure system 200 can be used for dirty process kit rings 242 and empty process kit ring carriers 240 and a second process kit enclosure system 200 can be used for clean process kit rings 242.

One or more handles 222 may be coupled to corresponding surfaces (e.g., exterior surfaces, sidewalls 210) of the process kit enclosure system 200 for transporting the process kit enclosure system 200. For example, handle 222A may be coupled to sidewall 210A and handle 222B may be coupled to sidewall 210B. The handles 222 may be configured for manual lifting and transporting of the process kit enclosure system 200. In some embodiments, an overhead transfer (OHT) flange is coupled to an exterior surface (e.g., top cover 216) of the process kit enclosure system 200 for transportation of the process kit enclosure system 200.

The process kit enclosure system 200 may include a registration feature 220 (e.g., coupled or integral to the bottom surface 212). The registration feature 220 may be used for robot calibration. The registration feature 220 may block a robot wafer mapper. The registration feature 220 may enable identification of the process kit enclosure system 200 as not being a wafer enclosure system (e.g., as not being a traditional FOUP carrying wafers). The registration feature 220 may enable identification of the process kit enclosure system 200 as a process kit enclosure system 200. The registration feature may enable identification of the specific process kit enclosure system 200 or the type of content of the process kit enclosure system 200. For example, the registration feature 220 may indicate that the process kit enclosure system 200 is supporting process kit rings 242 disposed on process kit ring carriers 240. In some embodiments, the registration feature 220 is a simple tab, peg, protrusion, etc. A factory interface robot may be configured to perform wafer mapping of contents of FOUPs to determine the number of wafers in a FOUP, the placement of the wafers, and so on. However, the process kit rings and process kit ring carriers may be at unexpected locations that are different from locations at which wafers would generally be positioned. To perform wafer mapping, the robot arm may move an end effector or other wafer mapper head to a bottom of the process kit enclosure system 200 to begin a wafer mapping process. However, the end effector and/or mapper head will encounter the registration feature 220, which may terminate the wafer mapping process. The presence of the registration feature 220 may provide a signal that indicates to controller 109 that a process kit enclosure system 200 is engaged to a load port rather than a traditional wafer-containing FOUP. In some embodiments, the process kit enclosure system 200 includes a registration feature 220 (e.g., FOUP type recognition feature via FI (front interface) robot mapping) and/or an auto-calibration feature (e.g., FI robot auto-calibration feature). The registration feature 220 may be located proximate the door frame 250 and the auto-calibration feature may protrude from proximate a center of a bottom surface of the interior (e.g., proximate the base plate 214) of the process kit enclosure system 200.

In some embodiments, one or more surfaces of the process kit enclosure system 200 have a transparent window 218 that enables a view of the process kit ring carriers 240 and the process kit rings 242. For example, a rear surface of the process kit enclosure system 200 may have a window 218 (e.g., see FIGS. 2A and 2E) and/or a top cover 216 of the process kit enclosure system 200 may have a window 218 (e.g., see FIG. 2B). The window may enable operators to visually inspect the contents of the process kit enclosure system to determine that process kit rings and/or process kit ring carriers are correctly stored therein, for example.

Content that enters the process kit enclosure system 200 from the wafer processing system may have corrosive substances (e.g., Hydrogen Bromide (HBr)) thereon. The process kit enclosure system 200 may be sealed to the load port of the wafer processing system to avoid escape of corrosive substances from the wafer processing system and process kit enclosure system 200. The process kit enclosure system 200 may be sealed to the load port of the wafer processing system for cleaning of the process kit enclosure system (e.g., decontamination of internal surfaces and features). Any electronics (e.g., battery, communications, sensors, microcontroller unit (MCU), etc.) associated with the process kit enclosure system (e.g., disposed in, coupled to) may be sealed The materials of the process kit enclosure system 200 may be compatible with corrosive substances (e.g., HBr). For example, the materials of the process kit enclosure system 200 may include one or more of polyethylene, acrylonitrile ethylene propylene diene monomer (AEPDM), ethylene propylene diene monomer (EPDM), perfluoroelastomer (FFKM) (e.g., Chemraz®), fluoroelastomer material (FKM) (e.g., Viton®), and/or polytetrafluoroethylene (PTFE) (e.g., Teflon®). The process kit enclosure system 200 may have purge ports (e.g., in the base plate 214, etc.). The purge ports may be used for a nitrogen purge (e.g., $N_2$ purge). For example, after the used process kit rings 242 are transferred to the process kit enclosure system 200, the purge ports may be used to clean contaminants from the process kit enclosure system 200 (e.g., transfer nitrogen gas into the process kit enclosure system 200 to evacuate HBr, etc. from the process kit enclosure system 200). One or more first purge ports may be used to push gas into the process kit enclosure system 200 and one or more second purge ports may be used to remove gas from the process kit enclosure system 200. In some embodiments, the process kit enclosure system 200 does not have any purge ports.

The base plate 214 of the process kit enclosure system 200 may include features (e.g., locating pins, mounting holes) to enable lower surfaces of the support structures 230 to engage with the base plate 214 (e.g., the bottom surface 212 may form corresponding holes for the engaging of the support structures 230 with the base plate 214).

The base plate 214 may include features (e.g., bearing surface) to enable lower surfaces of retention devices 260 (e.g., see FIG. 2F) to engage (e.g., rotatably couple) with the base plate 214.

The base plate 214 may include features (e.g., mounting holes) to enable the bottom surface 212 of the process kit enclosure system 200 to engage with the base plate 214.

The base plate 214 may include features (e.g., locating pins, mounting holes) to enable the door frame to engage with the base plate 214 (e.g., a sidewall of the door frame to engage with a sidewall of the base plate 214). The base plate 214 may include features (e.g., an auto-teaching mounting hole, FOUP docking track latch clamping feature, load port kinematic pin features, load port datum pin clearance, FOUP presence switch features, etc.) for docking the process kit enclosure system 200 on the wafer processing system (e.g., mounting the base plate 214 on a surface proximate the load port).

The front interface of the process kit enclosure system 200 may include a door frame 250 (see FIG. 2C, FIG. 2A may not display the door frame 250). The door frame 250 may include features (e.g., recesses) to enable the door frame 250 to engage with the base plate 214. The door frame 250 may include features (e.g., threaded inserts, such as screws, inserted into channels through the door frame 250 to engage with sidewalls 210) to enable the door frame 250 to engage with sidewalls 210 of the process kit enclosure system 200. The door frame 250 may have features (e.g., sealed load port side clamping features, recesses to receive clamp from load port) to enable the process kit enclosure system 200 to seal to the load port. The door frame 250 and/or door 252 may include features to couple to each other.

The process kit enclosure system 200 may include surfaces to partially enclose the interior volume 202. A portion of the surfaces may form an enclosure component that is a rectangular prism (e.g., cube) that has cutouts for transparent windows 218 and features. The enclosure component may include the bottom surface 212, the sidewalls 210A-B, a front lip, a top lip, and a rear lip. The front lip of the enclosure component may interface with the door frame. The top lip of the enclosure component may couple with the top cover 216. The top lip of the enclosure component may have a cutout for insertion of the support structures 230 into the interior volume 202. The rear lip of the enclosure component may couple with a window 218. The bottom surface 212 may include features (e.g., retention device lower pivot pins) for coupling to the retention devices 260. The bottom surface 212 may include features (e.g., cutouts) to allow the support structures 230 to mount to the base plate 214. The bottom surface 212 may be coupled to a registration feature 220 (e.g., process kit enclosure system 200 recognition feature). In some embodiments, the registration feature 220 and the bottom surface 212 are integral to each other.

FIG. 2B illustrates a top view of a process kit enclosure system 200, according to certain embodiments.

The top cover 216 of the process kit enclosure system 200 may include an upper surface and one or more flanges. The top cover 216 may include a docking offset flange for docking to the load port. The upper surface of the top cover 216 may have a window cutout for a transparent window 218. The upper surface of the top cover 216 may be coupled to the enclosure component by one or more fasteners (e.g., captive thumbscrews). The retention devices 260 may be taller than the top cover 216 and may be captured by the features (e.g., dimples) of the upper surface of the top cover 216. The base (e.g., lower portion) of each retention device 260 may be pinned to allow the retention devices 260 to rotate about z-axis (e.g., and to be removed for docking to the load port). Each retention device 260 may have features (e.g., approximately horizontal fins) that prevent content from coming out of the recess in the fins 232 of the support structures 230. There may be two retention devices 260 that have an angular pitch (e.g., not at 180 degrees). The features (e.g., dimples) in the upper surface of the top cover 216 may be sized to receive the retention features in the secured position (e.g., first rotated state) or unsecured position (e.g., second rotated state, removed, etc.).

In some embodiments, the top cover 216 has a docking position (e.g., docking flange on the same side as the door frame) and a transport position (e.g., docking flange on the same side as the rear window 218). The fasteners may be used to remove the top cover 216 in a first position and to attach the top cover 216 in a second position. The features (e.g., dimples) in the top cover 216 in the transport position may only receive the retention devices 260 in the secured position. The features (e.g., dimples) in the top cover 216 in the docking position may only receive the retention devices 260 in the unsecured position. In some embodiments, the secured position is rotating the retention devices 260 to secure the content on the fins 232 of the support structures 230. In some embodiments, the unsecured position is rotating the retention devices 260 to not secure the content on the fins 232 of the support structures 230. In some embodiments, the unsecured position is removing the retention devices 260 from the interior volume 202 of the process kit enclosure system 200 (e.g., removing the retention devices 260 prior to attaching the top cover 216 in the docking position).

In some embodiments, the top cover 216 includes a transparent window 218 to provide a view of the content on the support structures. In some embodiments, the top cover 216 does not include a transparent window 218.

FIG. 2C illustrates a side view of a process kit enclosure system 200, according to certain embodiments. A door frame 250 may be coupled to the sidewalls 210 and the base plate 214. A door 252 may be coupled to the door frame 250 for transportation of the process kit enclosure system 200. The door 252 may be removed from the process kit enclosure system 200 to load the process kit enclosure system 200 with content. The door 252 may be removed from the process kit enclosure system 200 to couple the process kit enclosure system 200 with the load port.

FIG. 2D illustrates a bottom view of a process kit enclosure system 200, according to certain embodiments. A base plate 214 may be disposed at the bottom of the process kit enclosure system 200. The base plate 214 may interface (e.g., have features that interface) with one or more features (e.g., kinematic pins, clamp, etc.) of a wafer processing system proximate the loading port. The base plate 214 may be coupled to one or more load port presence sensors, load port couplings interface, recesses, etc.

FIG. 2E illustrates a rear view of a process kit enclosure system 200, according to certain embodiments. In some embodiments, a transparent window 218 is coupled to the rear lip of the enclosure component of the process kit enclosure system 200 to provide a view of the content on the support structures 230. In some embodiments, a rear surface of the process kit enclosure system 200 does not include a transparent window 218 (e.g., instead of a rear lip, the enclosure component may include a rear sidewall 210C).

Figure 2F:
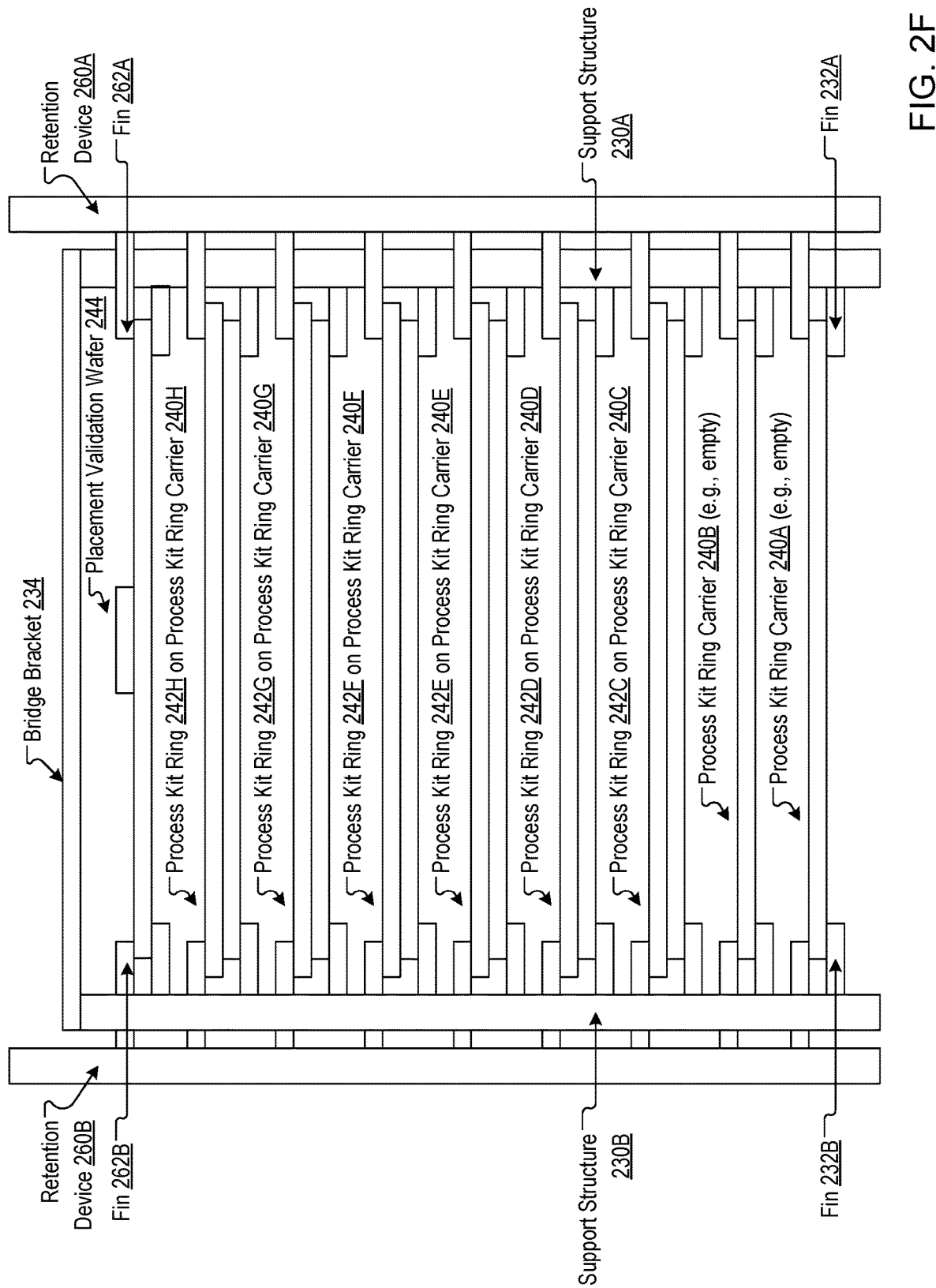
FIG. 2F illustrates the support structures and retention devices of a process kit enclosure system, according to certain embodiments.

FIG. 2F illustrates the support structures 230 and retention devices 260 of a process kit enclosure system 200, according to certain embodiments.

Content supported on the fins 232 of the support structures 230 may be constrained during transportation. For example, one or more retention devices 260 may secure each of the process kit rings 242 to a corresponding one of the process kit ring carriers 240 and may further secure each of the process kit ring carriers 240 within the process kit enclosure system 200 during transportation of the process kit enclosure system 200. A lockout feature (e.g., of the retention devices) may block engaging of the process kit enclosure system 200 with the load port of the wafer processing system responsive to the one or more retention devices 260 being in a secured position. The lockout feature may allow engaging of the process kit enclosure system 200 with the load port responsive to the retention devices 260 being in an unsecured position (e.g., removed or not engaging with an upper surface of the content). In some embodiments, coupling of the door 252 to the process kit enclosure system 200 may place the retention devices 260 in a secured position and removal of the door 252 from the process kit enclosure system 200 may place the retention devices 260 in an unsecured position. In some embodiments, to interface (e.g., engage, dock, etc.) the front interface of the process kit enclosure system 200 with the load port, the door 252 is removed, the top cover 216 is removed, the retention devices 260 are placed in the unsecured position (e.g., removed, rotated), and the top cover 216 attached in a docking position (e.g., rotated from the original transport position). The process kit enclosure system 200 may not dock without the top cover 216 in the docking position and the top cover 216 may not attach in the docking position without the retention devices 260 being in the unsecured position. To transport the process kit enclosure system 200, the top cover 216 may be removed, the retention devices 260 may be placed in a secured position (e.g., inserted in the interior volume 202 and/or rotated), the top cover 216 may be attached in the transport position (e.g., the top cover 216 may not be able to attach in the transport position if the retention devices 260 were not in the secured position), and the door 252 may be coupled to the process kit enclosure system 200 (e.g., the door 252 may not be able to attach when the top cover 216 is in the transport position). The retention devices 260 may be rotatable to the secured position to secure the process kit ring carriers 240. The retention devices 260 may also be rotatable to the unsecured position to cause each of the plurality of process kit ring carriers 240 to be unsecured.

The process kit ring carrier 240 and the process kit ring 242 secured to the process kit ring carrier 240 may be retained (e.g., by one or more retention devices 260) to minimize movement of the process kit ring carrier 240 and process kit ring 242. Process kit ring carriers 240 and/or process kit rings 242 may be retained by one or more of: friction; vacuum pads and a pilot check valve; passive edge grip; passive self-aligning; semi-active edge grip (e.g., human or machine rotated comb or lever, variable height adjustable comb to support variations of process kit ring sizes (e.g., predetermined or variable)); closing of the door 252 actuating retention devices 260; lever couple clamps carrier when process kit ring carrier 240 is seated due to weight of the process kit ring carrier 240 and process kit ring 242; one or more pneumatically powered clamps; and/or lever activated by sensor and retention devices 260 powered by an actuator.

In some embodiments, the process kit enclosure system 200 (e.g., support structures 230 and/or retention device) may capture six degrees of freedom (e.g., x-translation, y-translation, z-translation, x-rotation, y-rotation, and z-rotation) of the process kit ring carriers 240 and/or the process kit rings 242. The process kit ring 242 may be constrained in x-translation, y-translation, and z-rotation by features (e.g., buttons, extrusions) of the process kit ring carrier 240. The process kit ring 242 may be constrained in z-translation, x-rotation, and y-rotation by gravity. Responsive to the process kit ring 242 being effectively fully constrained on the upper surface of the process kit ring carrier 240 (e.g., by features of the process kit ring carrier 240 and gravity), the process kit enclosure system 200 (e.g., support structures 230 and/or retention devices 260) may be used to support and constrain the process kit ring carrier 240.

The process kit ring carrier 240 may have a perimeter that includes two curved edges that are opposite each other and two flat edges (e.g., parallel edges, straight edges) that are substantially parallel to each other. The support structures 230 may support the process kit ring carriers 240 at the flat edges.

In some embodiments, the retention devices 260 may capture six degrees of freedom of the process kit ring carriers 240 and the process kit rings 242. In some embodiments, the support structures 230 and the retention devices 260 may capture six degrees of freedom of the process kit ring carriers 240 and the process kit rings 242.

In some embodiments, the process kit enclosure system 200 includes a microcontroller and battery to positively secure the content on the support structures 230. For example, a microcontroller could place (e.g., rotate) the retention device 260 into a secured position (e.g., responsive to input that the process kit enclosure system 200 is to be transported) and into an unsecured position (e.g., responsive to input that the process kit enclosure system 200 is to be docked).

In some embodiments, the fins 262 of the retention device 260 may secure content of different heights. For example, the fins 262 may secure an empty process kit ring carrier 240 on a first set of fins 232 of the support structure (e.g., during transporting of the process kit enclosure system 200 to the loading port) and the fins 262 may secure a used process kit ring on a process kit ring carrier 240 on the first set of fins 232 of the support structure (e.g., during transporting of the process kit enclosure system 200 from the loading port after replacement of one or more process kit rings). For example, the fins 262 may be mass hooks that adjust for different heights of content on the fins 232 of the support structures 230.

FIG. 3A illustrates a cross sectional view of content (e.g., a process kit ring carrier 340 (e.g., process kit ring carrier 240 of FIG. 2A) or placement validation wafer 344 (e.g., placement validation wafer 244 of FIG. 2A)) on a fin 332 (e.g., fin 232 of FIG. 2A) of a support structure 330 (e.g., support structure 230 of FIG. 2A) of a process kit enclosure system 300 (e.g., process kit enclosure system 200 of FIG. 2A), according to certain embodiments. The fin 332 may form a recess and the content may be disposed in the recess. In some embodiments, an upper surface of the content includes an extrusion to couple with a process kit ring 342 (e.g., process kit ring 242).

FIG. 3B illustrates a cross sectional view of a process kit ring 342 disposed on a process kit ring carrier 340 on a fin 332 of a support structure 330 of a process kit enclosure system 300, according to certain embodiments. The process kit ring 342 may be constrained in x-translation, y-translation, and z-rotation by the extrusion of the process kit ring carrier 340. The process kit ring 342 may be constrained in z-translation, x-rotation, and y-rotation by gravity.

FIG. 3C illustrates a top view of a process kit ring carrier 340 on fins 332 of support structures 330 of a process kit enclosure system 300, according to certain embodiments. The process kit ring carrier 340 may be placed on the fins 332 manually or by a robotic arm. In some embodiments, the process kit enclosure system 300 may include four support structures 330 that each includes corresponding fins 332.

FIG. 3D illustrates a top view of retention devices 360 (e.g., retention devices 260 of FIG. 2F) and a process kit ring 342 disposed on a process kit ring carrier 340 on fin 332 of support structures 330 of a process kit enclosure system 300, according to certain embodiments. The upper surface of the process kit ring carrier 340 may have one or more extrusions (e.g., one extrusion per fin 332). The one or more extrusions may capture degrees of freedom (e.g., constrain movement) of the process kit ring 342.

FIG. 3E illustrates a top view of retention devices 360 securing a process kit ring 342 disposed on a process kit ring carrier 340 on a fin 332 of a support structure 330 of a process kit enclosure system 300, according to certain embodiments. The retention devices 360 may be rotated so that lower surfaces of the retention device 360 (e.g., lower surfaces of fins 362 of the retention device 360) are above the content on the fins 332. In some embodiments, the retention devices 360 are in contact with an upper surface of the content on the fins 332. For example, the fins 362 of the retention devices 360 may be in contact with an upper surface of the process kit rings 342. In some embodiments, the retention devices 360 are disposed above the content so that the content cannot fall from the fins 332. For example, the distance between a lower surface of the fins 362 of the retention devices 360 and the upper surface of the process kit rings 342 may be less than the height of the extrusions on the upper surface of the process kit ring carrier 340.

FIGS. 4A-I illustrate content disposed on one or more fins 432 of a process kit enclosure system 400, according to certain embodiments. In some embodiments, the content (e.g., process kit ring carrier 440, placement validation wafer 444) has a planar bottom surface on a first plane and has one or more features (e.g., extrusions, pads) that extend from the first plane. For example, the process kit ring carrier 440 may have one or more pads that wrap from a side surface of the process kit ring carrier 440 to a bottom surface of the process kit ring carrier 440. Each fin 432 may have a recess (e.g., slot) to receive the feature (e.g., pad) of the process kit ring carrier 440. In some embodiments, only the features of the process kit ring carrier 440 engage with the fin 432 (e.g., the planar bottom surface of the process kit ring carrier 440 does not engage with the fins 432). In some embodiments, the recesses of the fins 432 (that receive the pads of the process kit ring carrier 440) constrain movement of the process kit ring carrier 440 in the x-direction and the y-direction.

FIG. 4A illustrates a cross sectional view of content (e.g., a process kit ring carrier 440 (e.g., process kit ring carrier 240 of FIG. 2A) or placement validation wafer 444 (e.g., placement validation wafer 244 of FIG. 2A)) on a fin 432 (e.g., fin 232 of FIG. 2A) of a support structure 430 (e.g., support structure 230 of FIG. 2A) of a process kit enclosure system 400 (e.g., process kit enclosure system 200 of FIG. 2A), according to certain embodiments. The fin 432 may form a first recess and the content may be disposed in the first recess. The fin 432 may form a second recess to couple with a process kit ring 442 (e.g., process kit ring 242).

FIG. 4B illustrates a cross sectional view of a process kit ring 442 disposed on a process kit ring carrier 440 on a fin 432 of a support structure 430 of a process kit enclosure system 400, according to certain embodiments. The process kit ring 442 may be constrained in x-translation, y-translation, and z-rotation by the second recess of the fin 432 of the support structure 430. The process kit ring 442 may be constrained in z-translation, x-rotation, and y-rotation by gravity. The process kit ring carrier 440 may have a slot 452. The slot may correspond to a registration feature of the process kit ring 442 (e.g., flat interior sidewall surface or other registration feature of the process kit ring 442). In some embodiments a fin 432 may be sized and shaped (e.g., have a corresponding feature) for constraining movement of the process kit ring 442. For example, the fin 432 may have a second recess sized to receive the process kit ring 442. In some embodiments, a process kit ring orientation bracket may have one or more protrusions (e.g., pins) that engage with the registration feature of the process kit ring 442 (e.g., flat interior sidewall surface) for constraining movement of the process kit ring 442.

FIG. 4C illustrates a top view of a process kit ring carrier 440 on fins 432 of support structures 430 of a process kit enclosure system 400, according to certain embodiments. The process kit ring carrier 440 may be placed on the fins 432 manually or by a robotic arm. In some embodiments, the process kit enclosure system 400 may include three support structures 430 that each includes corresponding fins 432. In some embodiments, fins 432 of each of the support structures 430 form the first recess and fins 432 of one of the support structures 430 forms the second recess. The process kit ring carrier 440 may be disposed on one or more fins 432 (e.g., two fins, three fins, four fins, etc.).

FIG. 4D illustrates a top view of retention devices 460 (e.g., retention devices 260 of FIG. 2F) and a process kit ring 442 disposed on a process kit ring carrier 440 on fin 432 of support structures 430 of a process kit enclosure system 400, according to certain embodiments. A portion of the process kit ring 442 may be disposed within the second recess of a fin 432 of a support structure 430. The second recess formed by the fin 432 may capture degrees of freedom (e.g., constrain movement) of the process kit ring 442.

FIG. 4E illustrates a top view of retention devices 460 securing a process kit ring 442 disposed on a process kit ring carrier 440 on a fin 432 of a support structure 430 of a process kit enclosure system 400, according to certain embodiments. In some embodiments, the retention devices 460 may be rotated so that lower surfaces of the retention device 460 (e.g., lower surfaces of fins 462 of the retention device 460) are above the content on the fins 432. In some embodiments, the retention devices 460 are in contact with an upper surface of the content on the fins 432. For example, the fins 462 of the retention devices 460 may be in contact with an upper surface of the process kit rings 442. In some embodiments, the retention devices 460 are disposed above the content so that the content cannot fall from the fins 432. For example, the distance between a lower surface of the fins 462 of the retention devices 460 and the upper surface of the process kit rings 442 may be less than the height to be overcome to remove the process kit ring 442 from the second recess. In some embodiments, retention devices 460 may be placed in an unsecured position (e.g., rotated, rotated and removed, etc.) to transfer content (e.g., a process kit ring carrier 440 and/or a process kit ring 442 on a process kit ring carrier 440) into a processing system. In some embodiments, a retention device 460 may pivot to secure the process kit ring carrier 440 and/or process kit ring 442 responsive to a portion of the process kit ring carrier 440 engaging with the retention device.

Figure 4F:
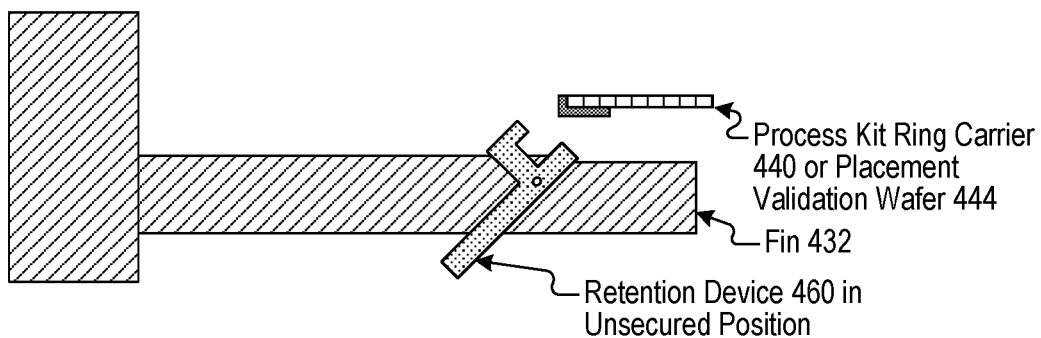
FIGS. 4F-I illustrate cross sectional views of content and a fin of a process kit enclosure system, according to certain embodiments.
Figure 4G:
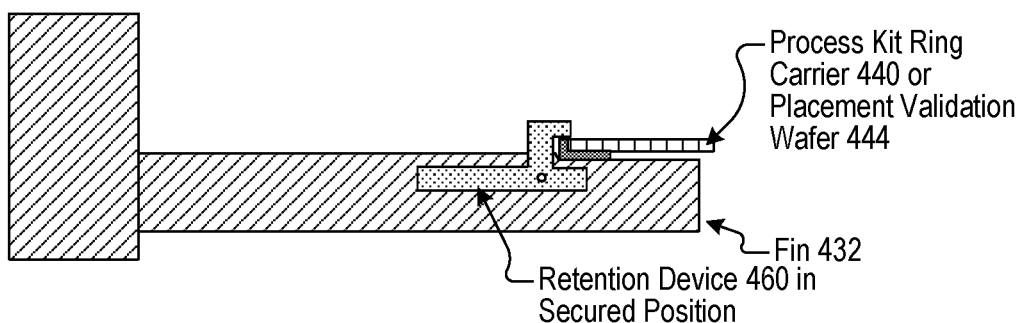
Figure 4H:
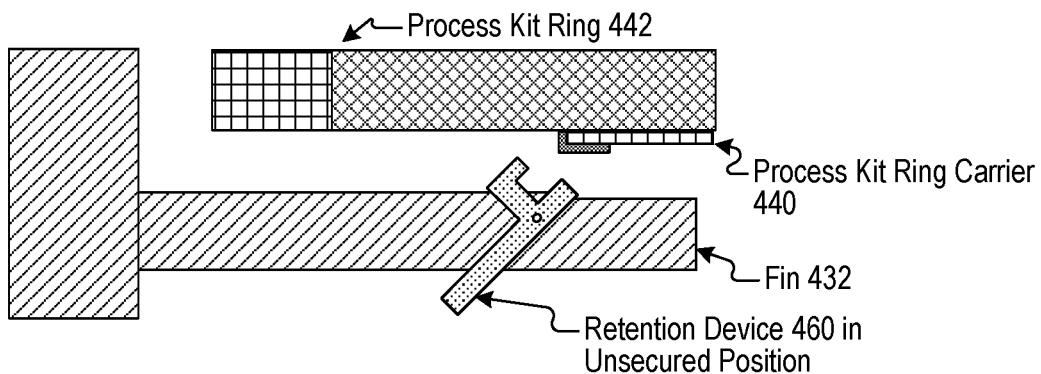
Figure 4I:
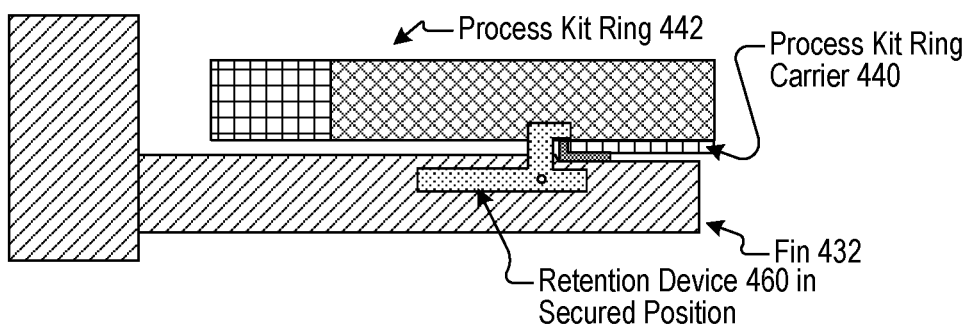

FIGS. 4F-I illustrate cross sectional views of content (e.g., a process kit ring carrier 440) and a fin 432 of a process kit enclosure system 400, according to certain embodiments. In some embodiments, the retention device 460 may be a pivoting clamp. When content (e.g., a process kit carrier 440) is not on the fin 432, the center of gravity of the retention device 460 may cause a clamp portion of the retention device 460 to be oriented to receive a content (e.g., as shown in FIGS. 4F and 4H, the clamp portion of the retention device 460 may be oriented upward). Upon lowering the content (e.g., process kit ring carrier 440 with or without a process kit ring 442 on the process kit ring carrier 440) onto the fin 432, the process kit ring carrier 440 may engage with the retention device 460 (e.g., with the clamp portion of the retention device 460) to cause the retention device 460 to pivot to a secured position (e.g., a first portion of the clamp portion of the retention device 460 above the process kit ring carrier 440 and a second portion of the clamp portion of the retention device 460 below the process kit ring carrier 440. In some embodiments, the clamp portion of the retention device 460 may be sized to receive one or more of a placement validation wafer 444, the process kit ring carrier 440, or the process kit ring 442 (e.g., the process kit ring 442 disposed on the process kit ring carrier 440). The process kit ring carrier 440 may have a one or more features (e.g., pad, foot, etc.), where a corresponding feature engages with each fin 432 (e.g., a recess of each fin 432). The one or more features may be the only portion of the process kit ring carrier 440 that engage with the fins 432.

Figure 5:
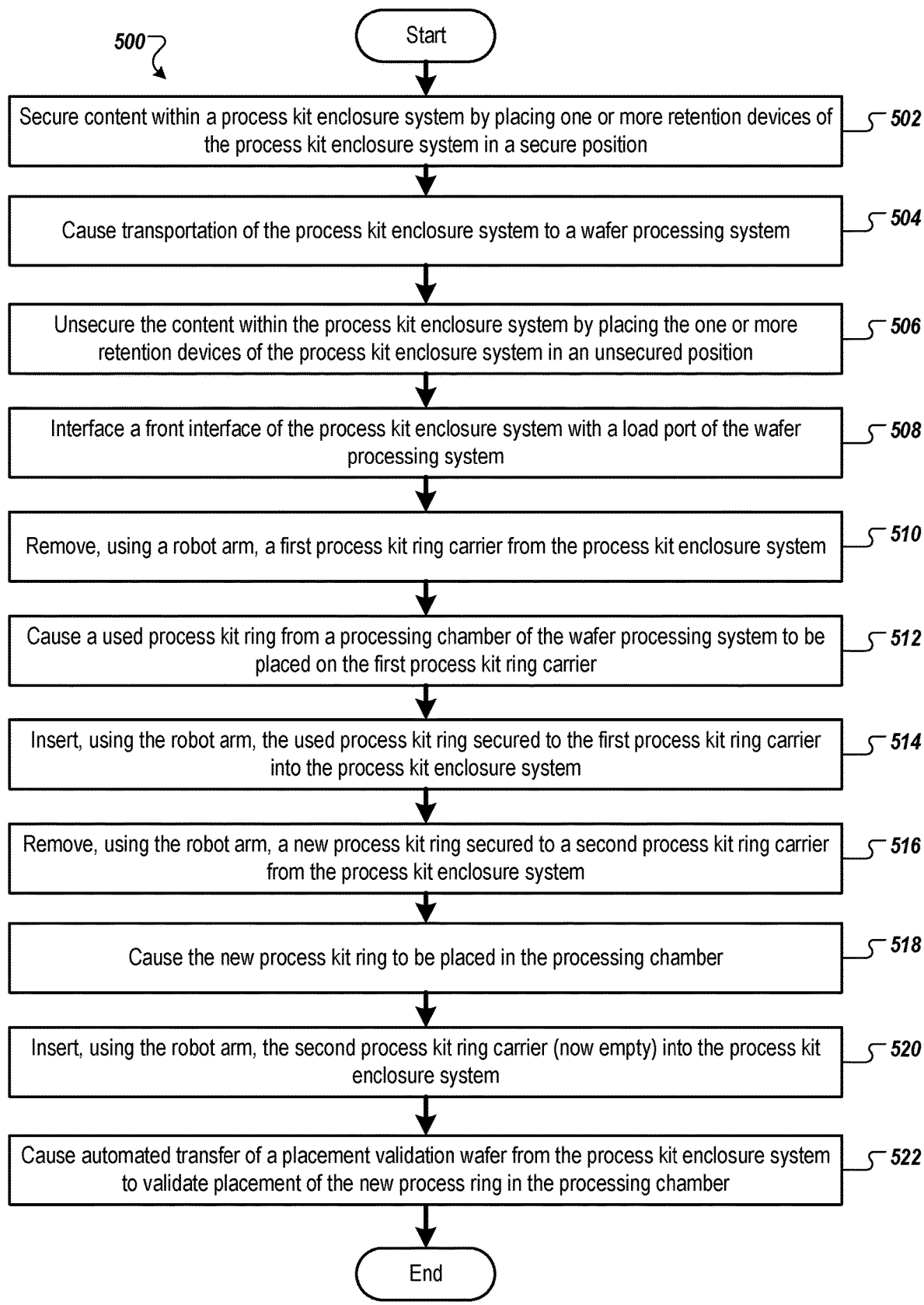
FIG. 5 illustrates a method for process kit ring replacement in processing chambers, according to certain embodiments.

FIG. 5 illustrates a method 500 for process kit ring replacement in processing chambers, according to certain embodiments. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

Content may be disposed in an interior volume of a process kit enclosure system. The content may be disposed on fins of support structures (e.g., comb structures) disposed in the interior volume of the process kit enclosure system. The content may include one or more of process kit ring carriers (e.g., empty or with a process kit ring disposed on the process kit ring carrier), process kit rings (e.g., disposed on the fins of the support structures, disposed on process kit ring carriers), or a placement validation wafer. The content may be manually loaded in the process kit enclosure system or the loading of the content into the process kit enclosure system may be automated (e.g., using robot arms).

At block 502, the content may be secured within the process kit enclosure system by placing one or more retention devices of the process kit enclosure system in a secured position. Retention devices may be rotated to secure the content to (e.g., prevent the content from falling from, prevent the content from going over features of) the fins of the support structures. For example, a top cover may be removed from the process kit enclosure system, the retention devices may be inserted into the interior volume of the process kit enclosure system so that the base of the retention devices couples with a pin at a bottom surface (and/or base plate) of the interior surface, the retention devices may be rotated so that the fins of the retention devices are above content on the fins of the support structures, and the top cover may be reattached to the process kit enclosure system. The top cover may not reattach unless the retention devices are rotated to be above the content on the support structures (e.g., un-rotated retention devices may block the attachment of the top cover, retention devices in a secured position may line up with dimples in the top cover whereas retention devices in an unsecured position may not line up with dimples).

At block 504, the process kit enclosure system may be transported to a wafer processing system. The process kit enclosure system may be manually transported by using one or more handles. The transportation of the process kit enclosure system may be automated using a handle (e.g., sidewall handles, OHT, etc.). A cart with robotic forks may be used for pulling and/or placing the process kit enclosure system from/to the load port.

At block 506, the content may be unsecured within the process kit enclosure system by placing the one or more retention devices of the process kit enclosure system in an unsecured position. In one embodiment, the top cover is removed, the retention devices are rotated to an unsecured position (e.g., to not be above the content on the support structures), are removed from the interior volume, and the top cover is re-attached.

At block 508, the front interface of the process kit enclosure system may be interfaced with a load port of the wafer processing system. For example, clamps may secure the door frame of the process kit enclosure system to the load port. The front interface of the process kit enclosure system and the load port may be sealed (e.g., an air seal).

At block 510, a robot arm may remove a first process kit ring carrier from the process kit enclosure system. The first process kit ring carrier may be empty. The robot arm may remove the first process kit ring carrier from a lower slot (e.g., bottom slot or slot above used process kit rings). The first process kit ring carrier may be the lowest empty process kit ring carrier in the process kit enclosure system. The robot arm may transfer the first process kit ring carrier into the wafer processing system.

At block 512, a used process kit ring from a processing chamber of the wafer processing system may be placed on the first process kit ring carrier. Lift pins (e.g., process kit ring lift pins) in the processing chamber may lift the used process kit ring, a robot arm may place the first process kit ring carrier below the used process kit ring, and the lift pins may lower to place the used process kit ring on the first process kit ring carrier.

At block 514, the robot arm may insert the used process kit ring secured to the first process kit ring carrier into the process kit enclosure system. The robot arm may place the used process kit ring secured to the first process kit ring carrier into the slot (e.g., lower slot) from which the first process kit ring carrier was removed.

At block 516, the robot arm may remove a new process kit ring secured to a second process kit ring carrier from the process kit enclosure system. The new process kit ring secured to the second process kit ring carrier may be in an upper slot of the process kit enclosure system that is above the lower slot corresponding to the first process kit ring carrier. The new process kit ring secured to the second process kit ring carrier may be in the lowest slot out of all of the new process kit rings in the process kit enclosure system (e.g., there may not be any new process kit rings below the new process kit ring secured to the second process kit ring carrier).

At block 518, the new process kit ring may be placed into the processing chamber. A robot arm may transfer the new process kit ring secured to the second process kit ring carrier into the processing chamber, the lift pins (e.g., process kit ring lift pins) in the processing chamber may lift the new process kit ring off of the second process kit ring carrier, the robot arm may retract the process kit ring carrier from the processing chamber, and the lift pins may lower the new process kit ring into position within the processing chamber.

At block 520, the robot arm may insert the second process kit ring carrier (now empty) into the process kit enclosure system. The robot arm may insert the second process kit ring carrier into the same slot from which the new process kit ring secured to the second process kit ring carrier was removed.

At block 522, a placement validation wafer may be transferred from the process kit enclosure system to validate placement of the new process ring in the processing chamber of the wafer processing system. The placement validation wafer may be disposed in a slot above the used process kit rings. The placement validation wafer may be dispose in an uppermost slot of the process kit enclosure system. The robot arm may remove the placement validation wafer for validation of placement of the new process ring.

Prior to causing transportation of the process kit enclosure system away from the wafer processing system, the content is to be secured within the process kit enclosure system by placing the one or more retention devices of the process kit enclosure system in a secured position. In one embodiment, the top cover is removed, the retention devices are placed into the interior volume, the retention devices are rotated to a secured position (e.g., to be above the content on the support structures), and the top cover is re-attached. The front interface of the process kit enclosure system may be unsecured from a load port of the wafer processing system (e.g., clamps securing the door frame of the process kit enclosure system to the load port may be unsecured). The door of the process kit enclosure system may be attached to the door frame after unsecuring the process kit enclosure system from the load port.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A process kit enclosure system comprising:
   a plurality of walls that at least partially enclose an interior volume of the process kit enclosure system;
   a first support structure comprising a first plurality of approximately horizontal fins, the first plurality of approximately horizontal fins comprising a first fin and a second fin;
   a second support structure comprising a second plurality of approximately horizontal fins, the second plurality of approximately horizontal fins comprising a third fin and a fourth fin, wherein the first fin and the third fin are configured to support a first process kit ring carrier that supports a first process kit ring in the interior volume, and wherein the second fin and the fourth fin are configured to support a second process kit ring carrier that supports a second process kit ring in the interior volume;
   a retention device structure disposed in the interior volume and comprising a first retention device fin extending from a retention device post, wherein the retention device structure is configured to be rotated between a first position and a second position, wherein the first retention device fin in the first position is disposed above and secures the first process kit ring, and in the second position the first retention device fin is outside a boundary of the first process kit ring, wherein the retention device post is aligned with and inserts into a recess formed by a top cover of the process kit enclosure system in the first position, and wherein the retention device post is misaligned with and blocked from inserting into the recess formed by the top cover in the second position; and a front interface coupled to one or more of the plurality of walls, wherein the front interface is configured to interface the process kit enclosure system with a wafer processing system, wherein the first process kit ring carrier supporting the first process kit ring is to be transferred via a robot from the first fin and the third fin in the process kit enclosure system into the wafer processing system, and the second process kit ring carrier supporting the second process kit ring being transferred via the robot from the wafer processing system onto the second fin and the fourth fin in the process kit enclosure system.

2. The process kit enclosure system of claim 1, wherein:
the retention device post comprises a first distal end and a second distal end, the first distal end being configured to be coupled to a bottom wall of the plurality of walls, and the second distal end being configured to be coupled to the top cover; and
a plurality of retention device fins are secured to the retention device post, the first retention device fin of the plurality of retention device fins being configured to secure the first process kit ring to the first process kit ring carrier disposed on the first fin and the third fin to secure the first process kit ring and the first process kit ring carrier within the process kit enclosure system during transportation of the process kit enclosure system.

3. The process kit enclosure system of claim 2, wherein:
the retention device post is configured to be rotated relative to the bottom wall to the first position; and
the retention device post is configured to be rotated relative to the bottom wall to the second position to cause an upper portion of the retention device structure to block attachment of the top cover to the plurality of walls.

4. The process kit enclosure system of claim 1, wherein the retention device post is:
rotatable to the first position to secure the first process kit ring on the first process kit ring carrier and the second process kit ring on the second process kit ring carrier; and
rotatable to the second position to cause the first process kit ring on the first process kit ring carrier and the second process kit ring on the second process kit ring carrier to be unsecured.

5. The process kit enclosure system of claim 1 further comprising:
a protrusion that extends from a bottom wall of the plurality of walls into the interior volume, wherein the protrusion is configured to enable identification via the robot of the process kit enclosure system as not being a wafer enclosure system.

6. The process kit enclosure system of claim 1 further comprising:
a transparent window that enables a view of the first process kit ring carrier and the first process kit ring.

7. The process kit enclosure system of claim 1, wherein the first support structure and the second support structure constrain movement of the first process kit ring carrier, the first process kit ring, the second process kit ring carrier, and the second process kit ring in each of six degrees of freedom.

8. The process kit enclosure system of claim 1, further comprising:
an empty process kit ring carrier disposed on a fifth fin of the first plurality of approximately horizontal fins and a sixth fin of the second plurality of approximately horizontal fins; and
the first process kit ring carrier disposed on a seventh fin of the first plurality of approximately horizontal fins and a eighth fin of the second plurality of approximately horizontal fins, wherein the first process kit ring carrier is positioned above the empty process kit ring carrier in the process kit enclosure system, and the first process kit ring is supported by the first process kit ring carrier.

9. The process kit enclosure system of claim 8, wherein a ninth fin of the first plurality of approximately horizontal fins and a tenth fin of the second plurality of approximately horizontal fins are sized to support a placement validation wafer, the process kit enclosure system further comprising:
the placement validation wafer located on the ninth fin and the tenth fin to enable third automated transfer of the placement validation wafer into the wafer processing system to validate placement of the first process kit in the wafer processing system.

10. The process kit enclosure system of claim 1 further comprising at least one of:
one or more side handles coupled to one or more exterior surfaces of one or more sidewalls of the plurality of walls of the process kit enclosure system for transportation of the process kit enclosure system; or
an overhead transfer (OHT) flange coupled to a first exterior surface of an upper wall of the plurality of walls for the transportation of the process kit enclosure system.

11. A process kit enclosure system comprising:
a plurality of walls to at least partially enclose an interior volume of the process kit enclosure system;
a first support structure disposed within the interior volume, the first support structure comprising a first substantially vertical post and a first plurality of approximately horizontal fins extending from the first substantially vertical post, wherein the first substantially vertical post is attached to a base plate of the process kit enclosure system;
a second support structure disposed within the interior volume, the second support structure comprising a second substantially vertical post and a second plurality of approximately horizontal fins extending from the second substantially vertical post, wherein the second substantially vertical post is attached to the base plate;
an empty process kit ring carrier disposed on a first approximately horizontal fin of the first support structure and on a second approximately horizontal fin of the second support structure;
a plurality of process kit ring carriers disposed on corresponding approximately horizontal fins of the first support structure and the second support structure, wherein the plurality of process kit ring carriers are positioned above the empty process kit ring carrier in the process kit enclosure system, and wherein a corresponding process kit ring is supported by each of the plurality of process kit ring carriers;
a placement validation wafer disposed on a third approximately horizontal fin of the first support structure and on a fourth approximately horizontal fin of the second support structure, wherein the placement validation wafer is positioned above the plurality of process kit ring carriers in the process kit enclosure system; and
a retention device structure disposed in the interior volume and comprising a first retention device fin extending from a retention device post, wherein the retention device structure is configured to be rotated between a first position and a second position, wherein the first retention device fin in the first position is disposed above and secures a first process kit ring, and in the second position the first retention device fin is outside a boundary of the first process kit ring, wherein the retention device post is aligned with and inserts into a recess formed by a top cover of the process kit enclosure system in the first position, and wherein the retention device post is misaligned with and blocked from inserting into the recess formed by the top cover in the second position.

12. The process kit enclosure system of claim 11, wherein the process kit enclosure system enables first automated transfer of the empty process kit ring carrier into a wafer processing system and second automated transfer of the empty process kit ring carrier supporting a used process kit ring from the wafer processing system into the process kit enclosure system.

13. The process kit enclosure system of claim 11, wherein the process kit enclosure system enables first automated transfer of a first process kit ring carrier supporting the first process kit ring from the process kit enclosure system into a wafer processing system and second automated transfer of a second process kit ring carrier supporting a second process kit ring from the wafer processing system into the process kit enclosure system.

14. The process kit enclosure system of claim 13, wherein the process kit enclosure system enables third automated transfer of the placement validation wafer into the wafer processing system to validate placement of the first process kit ring in the wafer processing system.

15. A method comprising:
  interfacing a front interface of a process kit enclosure system with a wafer processing system, wherein an interior volume of the process kit enclosure system is enclosed by a plurality of walls of the process kit enclosure system to which the front interface is coupled, wherein a first plurality of approximately horizontal fins comprising a first fin and a second fin are disposed in the interior volume, wherein a second plurality of approximately horizontal fins comprising a third fin and a fourth fin that are disposed in the interior volume, wherein the first fin and the third fin are configured to support a first process kit ring carrier that supports a first process kit ring in the interior volume, wherein a retention device structure comprises a first retention device fin extending from a retention device post from the interior volume, wherein the retention device structure is configured to be rotated between a first position and a second position, wherein the first retention device fin in the first position is disposed above and secures the first process kit ring, and in the second position the first retention device fin is outside a boundary of the first process kit ring, wherein the retention device post is aligned with and inserts into a recess formed by a top cover of the process kit enclosure system in the first position, and wherein the retention device post is misaligned with and blocked from inserting into the recess formed by the top cover in the second position;
  using a robot arm to perform a first automated transfer of the first process kit ring carrier supporting the first process kit ring from the first fin and the third fin of the process kit enclosure system into the wafer processing system; and
  using the robot arm or an additional robot arm to perform a second automated transfer of a second process kit ring carrier supporting a used second process kit ring from the wafer processing system onto the second fin and the third fin in the process kit enclosure system.

16. The method of claim 15 further comprising:
  prior to the interfacing of the front interface of the process kit enclosure system with the wafer processing system, securing, by the retention device structure, the first process kit ring to the first process kit ring carrier within the process kit enclosure system during transportation of the process kit enclosure system, wherein:
    the retention device post comprises a first distal end and a second distal end, the first distal end being configured to be coupled to a bottom wall of the plurality of walls, and the second distal end being configured to be coupled to the top cover; and
    a plurality of retention device fins are secured to the retention device post, the first retention device fin of the plurality of retention device fins being configured to secure the first process kit ring to the first process kit ring carrier disposed on the first fin and the third fin to secure the first process kit ring and the first process kit ring carrier within the process kit enclosure system during the transportation of the process kit enclosure system.

17. The method of claim 16, wherein:
  the retention device post is configured to be rotated relative to the bottom wall to the first position; and
  the retention device post is configured to be rotated relative to the bottom wall to the second position to cause an upper portion of the retention device structure to block attachment of the top cover to the plurality of walls.

18. The method of claim 15, wherein the retention device post is:
  rotatable to the first position to secure the first process kit ring on the first process kit ring carrier and the used second process kit ring on the second process kit ring carrier; and
  rotatable to the second position to cause the first process kit ring on the first process kit ring carrier and the used second process kit ring on the second process kit ring carrier to be unsecured.

19. The method of claim 15, wherein:
  the second automated transfer of the second process kit ring carrier comprises:
    using the robot arm to remove the second process kit ring carrier from the process kit enclosure system;
    causing the used second process kit ring from a process chamber of the wafer processing system to be supported by the second process kit ring carrier; and
    using the robot arm to insert the used second process kit ring supported by the second process kit ring carrier into the process kit enclosure system; and
  the first automated transfer of the first process kit ring carrier comprises:
    using the robot arm to remove the first process kit ring supported by the first process kit ring carrier from the process kit enclosure system;
    causing the first process kit ring to be placed into the process chamber; and
    using the robot arm to insert the first process kit ring carrier into the process kit enclosure system.

20. The method of claim 19, wherein:
  the second process kit ring carrier is removed from a first slot of the process kit enclosure system;
  the used second process kit ring supported by the second process kit ring carrier is inserted into the first slot of the process kit enclosure system;

the first process kit ring supported by the first process kit ring carrier is removed from a second slot of the process kit enclosure system that is above the first slot; and the first process kit ring carrier is inserted into the second slot.

* * * * *